(12) United States Patent
Yuh

(10) Patent No.: US 9,620,681 B2
(45) Date of Patent: Apr. 11, 2017

(54) SEMICONDUCTOR DEVICE AND METHOD OF MANUFACTURING THE SAME

(71) Applicant: LG Electronics Inc., Seoul (KR)

(72) Inventor: Hwankuk Yuh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/830,508

(22) Filed: Aug. 19, 2015

(65) Prior Publication Data

US 2016/0099383 A1    Apr. 7, 2016

(30) Foreign Application Priority Data

Oct. 7, 2014    (KR) .................. 10-2014-0135207

(51) Int. Cl.
| | | |
|---|---|---|
| H01L 33/00 | (2010.01) | |
| H01L 33/38 | (2010.01) | |
| H01L 33/20 | (2010.01) | |
| H01L 29/40 | (2006.01) | |
| H01L 33/42 | (2010.01) | |

(52) U.S. Cl.
CPC ........... *H01L 33/385* (2013.01); *H01L 29/40* (2013.01); *H01L 33/0095* (2013.01); *H01L 33/20* (2013.01); *H01L 33/42* (2013.01); *H01L 2933/0016* (2013.01)

(58) Field of Classification Search
CPC ..... H01L 33/385; H01L 33/382; H01L 33/42; H01L 33/005; H01L 33/20; H01L 33/0095; H01L 2933/0016; H01L 29/40
See application file for complete search history.

(56) References Cited

U.S. PATENT DOCUMENTS

2013/0146841 A1    6/2013    Yun et al.
2013/0181249 A1    7/2013    Aoyagi et al.

FOREIGN PATENT DOCUMENTS

| JP | 2013-157496 A | 8/2013 |
|---|---|---|
| KR | 10-2009-0010623 A | 1/2009 |
| KR | 10-2011-0118332 A | 10/2011 |
| KR | 10-2014-0069907 A | 6/2014 |
| KR | 10-2014-0104719 A | 8/2014 |

*Primary Examiner* — Victor A Mandala
*Assistant Examiner* — Colleen E Snow
(74) *Attorney, Agent, or Firm* — Birch, Stewart, Kolasch & Birch, LLP

(57) ABSTRACT

A semiconductor device including a first conductivity type semiconductor layer, an active layer, and a second conductivity type semiconductor layer which are sequentially stacked; a first conductivity type upper electrode portion and a first conductivity type lower electrode portion disposed to correspond to each other with the first conductivity type semiconductor layer interposed therebetween; a second conductivity type upper electrode portion and a second conductivity type lower electrode portion disposed to correspond to each other with the first and second conductivity type semiconductor layers interposed therebetween; and a second conductivity type electrode connection portion electrically connecting the second conductivity type upper electrode portion and the second conductivity type lower electrode portion.

20 Claims, 26 Drawing Sheets

SEMICONDUCTOR DEVICE AND METHOD OF MANUFACTURING THE SAME

CROSS-REFERENCE TO RELATED APPLICATION

Pursuant to 35 U.S.C. §119(a), this application claims the benefit of earlier filing date and right of priority to Korean Application No. 10-2014-0135207, filed in filed in Republic of Korea on Oct. 7, 2014 the contents of which are incorporated by reference herein in its entirety.

BACKGROUND OF THE INVENTION

1. Field of the Invention

The present disclosure relates to a semiconductor device and a manufacturing method thereof, and more particularly, to a semiconductor device including a diode and a manufacturing method thereof.

2. Background of the Invention

A light emitting diode (LED) converts electric energy into optical energy. Recently, the use of LEDs has significantly increased. In particular, research has been conducted to implement a large-scale LED. As the area of an LED increases, an electrode structure for evenly distributing a current within the LED is complicated and the efficiency thereof is lowered. Recently, a method of disposing a plurality of LED chips having an optimal small size on a package board has been proposed. However, the process of assembling the LED chips on the package board is inefficient and results in poor yield.

SUMMARY OF THE INVENTION

Therefore, an aspect of the detailed description is to provide a semiconductor device allowing LED chips that can be rapidly assembled on a package board and having an enhanced operation reliability.

Another aspect of the detailed description is to provide a method of manufacturing a semiconductor device capable of rapidly assembling LED chips on a package board and enhancing an operation reliability.

To achieve these and other advantages and in accordance with the purpose of this specification, as embodied and broadly described herein, the present invention provides in one aspect a semiconductor device including a first conductivity type semiconductor layer, an active layer, and a second conductivity type semiconductor layer which are sequentially stacked; a first conductivity type upper electrode portion and a first conductivity type lower electrode portion disposed to correspond to each other with the first conductivity type semiconductor layer interposed therebetween; a second conductivity type upper electrode portion and a second conductivity type lower electrode portion disposed to correspond to each other with the first and second conductivity type semiconductor layers interposed therebetween; and a second conductivity type electrode connection portion electrically connecting the second conductivity type upper electrode portion and the second conductivity type lower electrode portion. The present invention also provides a corresponding method of manufacturing the semiconductor device.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Hereinafter, embodiments of the present disclosure will be described in detail with reference to the accompanying drawings. Specific structural or functional descriptions of embodiments of the preset invention disclosed in the present disclosure or application are illustrated for the purpose of describing embodiments of the present invention. Embodiments of the present invention may be implemented in various forms and should not be construed to be limited to the embodiments described in the present disclosure or application.

The present invention may be modified variably and may have various embodiments, particular examples of which will be illustrated in drawings and described in detail. However, the present invention is not limited to a specific disclosed form, but includes all modifications, equivalents, and substitutions without departing from the scope and spirit of the present invention.

Figure 1:
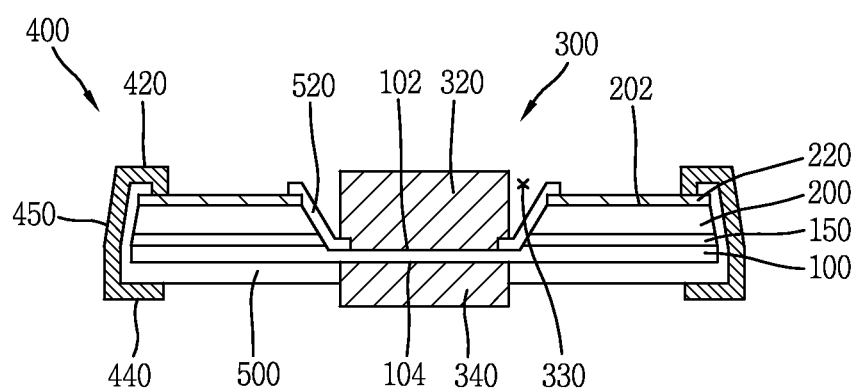
FIG. 1 is a cross-sectional view illustrating a semiconductor device according to an embodiment of the present disclosure.
Figure 2:
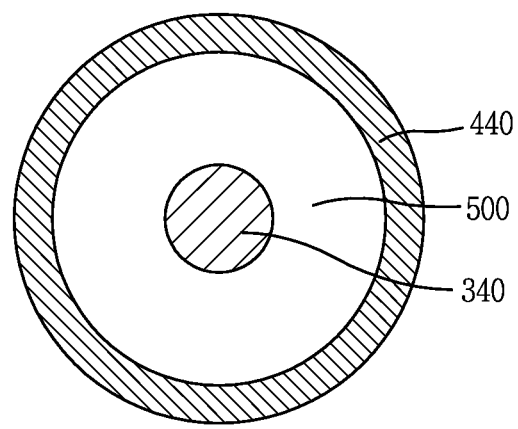
FIGS. 2 and 3 are plan views illustrating the semiconductor device of FIG. 1.
Figure 3:
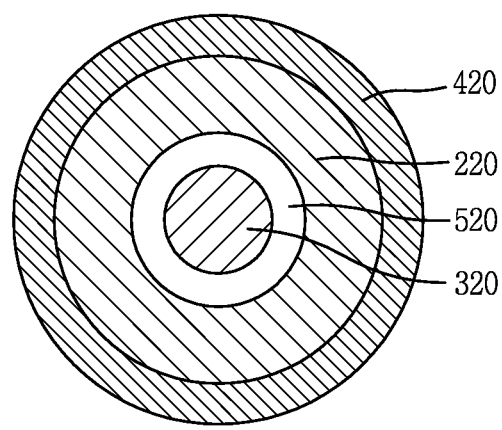
Figure 4:
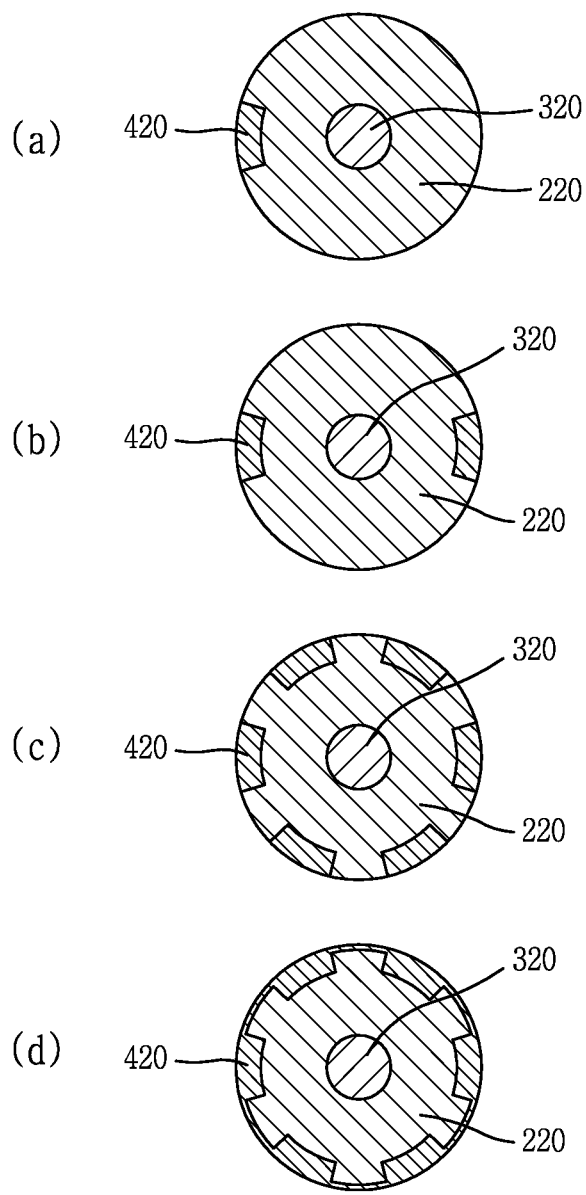
FIGS. 4 and 5 are plan views illustrating semiconductor devices according to embodiments of the present disclosure.
Figure 5:
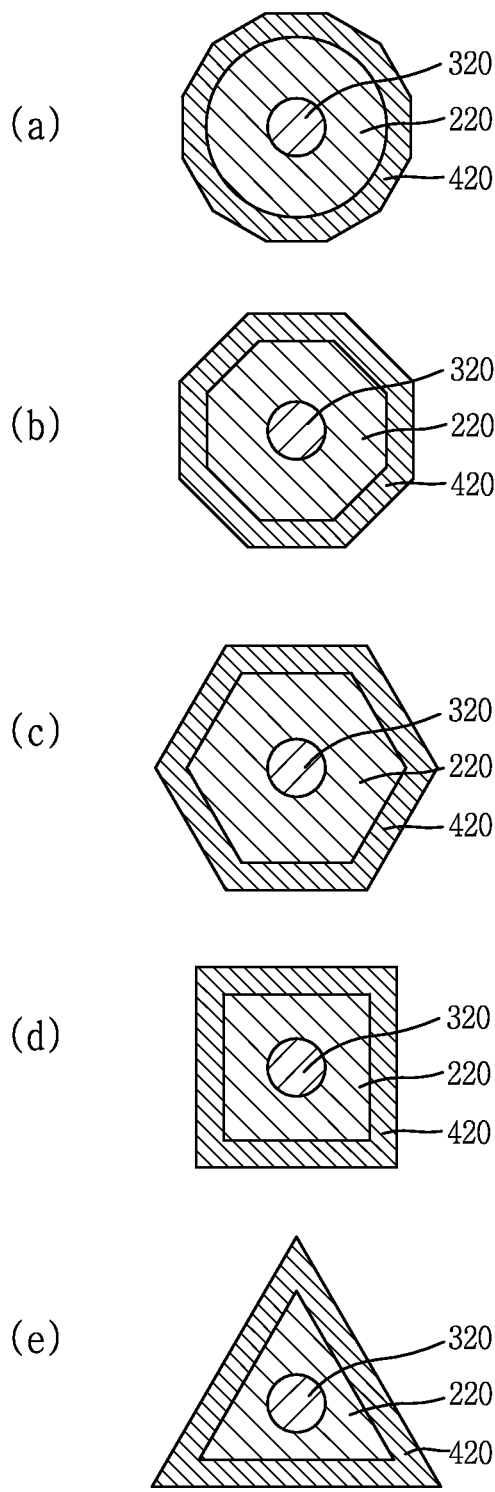
Figure 6:
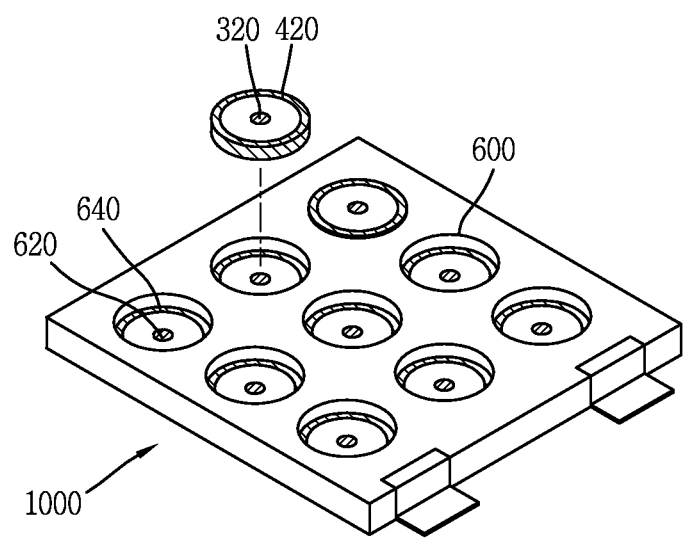
FIGS. 6 and 7 are perspective views illustrating assembling of semiconductor devices of FIG. 1 to a package board.
Figure 7:
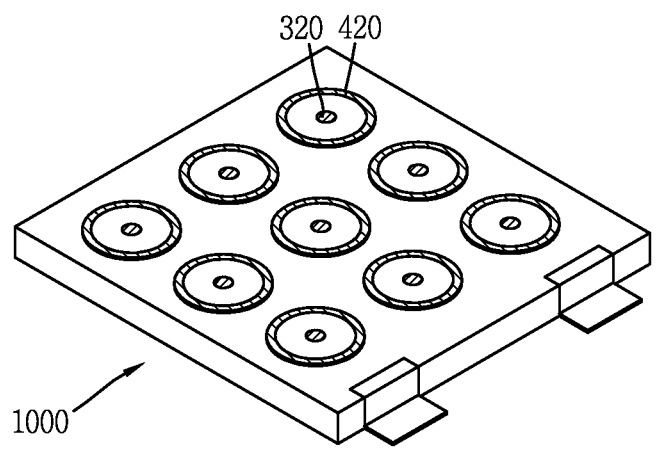

FIG. 1 is a cross-sectional view illustrating a semiconductor device according to embodiments of the present disclosure; FIGS. 2 and 3 are plan views illustrating the semiconductor device of FIG. 1; FIGS. 4 and 5 are plan views illustrating semiconductor devices according to embodiments of the present disclosure; and FIGS. 6 and 7 are perspective views illustrating assembling of semiconductor devices of FIG. 1 to a package board.

Referring to FIGS. 1 through 7, a semiconductor device according to embodiments of the present disclosure includes a first conductivity type semiconductor layer 100, an active layer 150, and a second conductivity type semiconductor layer 200 which area sequentially stacked, a first conductivity type electrode 300 connected to the first conductivity type semiconductor layer 100, and a second conductivity type electrode 400 connected to the second conductivity type semiconductor layer 200.

The first conductivity type electrode 300 includes a first conductivity type upper electrode portion 320 and a first conductivity type lower electrode portion 340 disposed to correspond to each other with the first conductivity type semiconductor layer 100 interposed therebetween. The second conductivity type electrode 400 includes a second conductivity type upper electrode portion 420 and a second conductivity type lower electrode portion 440 disposed to correspond to each other with the first and second conductivity type semiconductor layers 100 and 200 interposed therebetween.

The first conductivity type semiconductor layer 100 and the second conductivity type semiconductor layer 200 may include a GaN-based semiconductor material, a ZnO-based semiconductor material, a GaAs-based semiconductor material, a GaP-based semiconductor material, or a GaAsP-based semiconductor material. For example, the first conductivity type semiconductor layer 100 and the second conductivity type semiconductor layer 200 may be an n type semiconductor layer and a p type semiconductor layer, respectively. Also, the n type semiconductor layer may include impurities such as silicon (Si), germanium (Ge), selenium (Se), tellurium (Te), carbon (C), and the like, to have a plurality of free electrons. The p type semiconductor layer may include impurities such as manganese (Mg), zinc (Zn), or beryllium (Be), and the like, to have a plurality of holes.

The active layer 150 is interposed between the first conductivity type semiconductor layer 100 and the second conductivity type semiconductor layer 200 and provides a region for the free electrons included in the first conductivity type semiconductor layer 100 and the holes included in the second conductivity type semiconductor layer 200. When the free electrons and the holes are combined, the active layer 150 converts electric energy into light energy to activate light emission. Thus, the active layer 150 includes, for example, a material having an energy band gap smaller than those of the first conductivity type semiconductor layer 100 and the second conductivity type semiconductor layer 200.

For example, when the first and second conductivity type semiconductor layers 100 and 200 include a GaN-based semiconductor material, the active layer 150 can include an InGaN-based semiconductor material. Also, in order to adjust a wavelength of emitted light, that is, a color of light, the active layer 150 can include AlGaAs, GaAsP, GaP, SiC, InGaAlP, or InGaN.

In addition, the first conductivity type electrode 300 is connected to the first conductivity type semiconductor layer 100 and supplies the free electrons to the first conductivity type semiconductor layer 100. The first conductivity type electrode 300 includes a conductive material. Also, the first conductivity type electrode 300 may be an n type electrode. For example, the first conductivity type electrode 300 may include lead (Pb), tin (Sn), gold (Au), germanium (Ge), copper (Cu), bismuth (Bi), cadmium (Cd), zinc (Zn), silver (Ag), nickel (Ni), or titanium (Ti).

Further, the second conductivity type electrode 400 is connected to the second conductivity type semiconductor layer 200 and supplies holes to the second conductivity type semiconductor layer 200. The second conductivity type electrode 400 also includes a conductive material. Also, the second conductivity type electrode 400 may be a p type electrode. For example, the second conductivity type electrode 400 may include Pb or Au.

The first conductivity type electrode 300 includes the first conductivity type upper electrode portion 320 spaced apart from the second conductivity type semiconductor layer 200 and the active layer 150 and disposed on one surface 102 of the first conductivity type semiconductor layer 100 and the first conductivity type lower electrode portion 340 disposed on the other surface 104 of the first conductivity type semiconductor layer 100.

In one embodiment, the first conductivity type upper electrode portion 320 is disposed on one surface 102 of the first conductivity type semiconductor layer 100 exposed to an electrode hole 330 (see FIG. 1) penetrating through the second conductivity type semiconductor layer 200 and the active layer 150. The electrode hole 330 can be formed by removing a portion of the first conductivity type semiconductor layer 100 penetrating through the second conductivity type semiconductor layer 200 and the active layer 150. In addition, because the electrode hole 330 is formed by removing a portion of the first conductivity type semiconductor layer 100, the first conductivity type upper electrode portion 320 is surrounded by the second conductivity type semiconductor layer 200 and the active layer 150 and at least a portion of the first conductivity type upper electrode portion 320 is covered by the first conductivity type semiconductor layer 100.

Also, the first conductivity type upper electrode portion 320 has a shape protruding from one surface 202 of the second conductivity type semiconductor layer 200 so as to be brought into contact with a package board. In addition, the first conductivity type lower electrode portion 340 is electrically connected to the first conductivity type upper electrode portion 320, and is disposed on the other surface of the first conductivity type semiconductor layer 100 such that the first conductivity type lower electrode portion 340 corresponds to the first conductivity type upper electrode portion 320.

Further, the second conductivity type electrode 400 includes the second conductivity type upper electrode portion 420 disposed on the second conductivity type semiconductor layer 200, the second conductivity type lower electrode portion 440 disposed below the first conductivity type semiconductor layer 100 such that the second conductivity type lower electrode portion 440 corresponds to the second conductivity type upper electrode portion 420, and a second conductivity type electrode connection portion 450 electrically connecting the second conductivity type upper electrode portion 420 and the second conductivity type lower electrode portion 440.

The second conductivity type upper electrode portion 420 is disposed on the second conductivity type semiconductor layer 200 and supplies holes to the second conductivity type semiconductor layer 200. In embodiments of the present disclosure, the semiconductor device also includes a transparent electrode layer 220 stacked on the second conductivity type semiconductor layer 200. For example, the transparent electrode layer 220 may include indium tin oxide (ITO).

Also, the second conductivity type upper electrode portion 420 is disposed on the transparent electrode layer 220. The transparent electrode layer 220 thus evenly supplies holes supplied from the second conductivity type upper electrode portion 420 to the second conductivity type semiconductor layer 200. Further, a metal layer is interposed between the transparent electrode layer 220 and the upper electrode portion 420 to improve contact resistance between the transparent electrode layer 220 and the second conductivity type upper electrode portion 420.

The second conductivity type lower electrode portion 440 is also insulated from the first conductivity type semiconductor layer 100 and disposed below the first conductivity type semiconductor layer 100 such that the second conductivity type lower electrode portion 440 corresponds to the second conductivity type upper electrode portion 420. Also, the second conductivity type electrode connection portion 450 electrically connects the second conductivity type upper electrode portion 420 and the second conductivity type lower electrode portion 440.

In embodiments of the present disclosure, the semiconductor device further includes a first insulating layer 500 at least partially covering a side surface of the active layer 150, a side surface of the second conductivity type semiconductor layer 200, and a side surface and a lower surface of the first conductivity type semiconductor layer 100. The first insulating layer 500 insulates the second conductivity type lower electrode portion 440 and the second conductivity type electrode connection portion 450 from the first conductivity type semiconductor layer 100.

For example, at least a portion of a side surface and a lower surface of the first insulating layer 500 may be covered by the second conductivity type lower electrode portion 440 and the second conductivity type electrode connection portion 450. Also, the semiconductor device includes a second insulating layer 520 at least partially covering a side surface of the electrode hole 330. The second insulating layer 520 accommodates the first conductivity type upper electrode portion 320, and reduces a leakage current flowing between the first conductivity type upper electrode portion 320 and the second conductivity type upper electrode portion 420.

As illustrated in FIGS. 2 and 3, in embodiments of the present disclosure, the second conductivity type upper electrode portion 420 extends in a circumferential direction so as to be disposed on an edge portion of the second conductivity type semiconductor layer 200. Also, the second conductivity type lower electrode portion 440 extends in the circumferential direction so as to be disposed on the edge portion of the first conductivity type semiconductor layer 100. Further, the second conductivity type electrode connection portion 450 extends in the circumferential direction and electrically connects the second conductivity type upper electrode portion 420 and the second conductivity type lower electrode portion 440.

As illustrated in FIG. 4, a plurality of second conductivity type upper electrode portions 420 can be provided and spaced apart from one another in the circumferential direction centered on the first conductivity type upper electrode portion 320 on the second conductivity type semiconductor layer 200. In FIG. 4, for the purposes of description, illustration of the first and second insulating layers 500 and 520 is omitted. Also, a plurality of second conductivity type lower electrode portions 440 may be provided and spaced apart from one another in the circumferential direction centered on the first conductivity type lower electrode portion 340. The second conductivity type lower electrodes 440 may be disposed to correspond to the first conductivity type upper electrodes 320, respectively.

When the second conductivity type upper and lower electrodes 420 and 440 are spaced apart from one another in the circumferential direction, the overall area of the electrodes is reduced, and thus a degradation of optical efficiency due to absorption of light generated by the active layer 150 to the second conductivity type upper and lower electrode portions 420 and 440 is reduced. Also, in order to reduce a degradation of optical efficiency due to the first conductivity type upper and lower electrode portions 320 and 340 and the second conductivity type upper and lower electrode portions 420 and 440, a reflective electrode layer can be stacked on one surfaces of the first conductivity type upper and lower electrode portions 320 and 340 and the second conductivity type upper and lower electrode portions 420 and 440. For example, the reflective electrode layer may include silver (Ag) or aluminum (Al).

As illustrated in FIG. 5, the semiconductor device can have a symmetrical shape. For example, when viewed from above, the semiconductor device can have a circular shape or a regular polygonal shape. In FIG. 4, for the purposes of description, illustration of the first and second insulating layers 500 and 520 is omitted. FIGS. 5(*a*)-(*e*) illustrates the semiconductor device has a regular dodecagonal shape, a regular octagonal shape, a regular hexagonal shape, a regular quadrangular shape, respectively, and a regular triangular shape, but the present disclosure is not limited thereto. Since the semiconductor device has a symmetrical shape, a possibility of assembling the semiconductor device to a package board can increase. This results in increasing an assembling speed of the package board.

As illustrated in FIGS. 6 and 7, a package board 1000 includes a plurality of concave recesses 600. The recesses 600 are disposed in positions corresponding to the first conductivity type upper electrode portion 320 or the first conductivity type lower electrode portion 340 and have a first conductive member 620 electrically connected to the first conductivity type upper electrode portion 320 or the first conductivity type lower electrode portion 340.

Also, each of the recesses 600 are disposed in positions corresponding to the second conductivity type upper electrode portion 420 or the second conductivity type lower electrode portion 440 and have a second conductive member 640 electrically connected to the second conductivity type upper electrode portion 420 or the second conductivity type lower electrode portion 440. For example, the first and second conductive members 620 and 640 may be metal balls or conductive pads.

A self-assembly method is a method in which the package board 1000 and a plurality of semiconductor devices according to embodiments of the present disclosure are introduced into a chamber filled with a fluid, and the semiconductor devices are allowed to be assembled by themselves to the recesses 600 provided on the package board 1000 through the fluid. Through the self-assembly method, the first and second conductivity type upper electrodes 320 and 420 are connected to the first and second conductive members 620 and 640 provided in the recess portions 600, whereby the semiconductor device may be installed in the package board 1000. Also, the first and second conductivity type lower electrodes 340 and 440 are connected to the first and second conductive members 620 and 640 provided in the recess portions 600, whereby the semiconductor device can be installed in the package board 1000.

For a horizontal structure type diode in which n type and p type electrodes are formed only in an upper portion, or a vertical structure type diode in which an n type electrode is formed in an upper portion and a p type electrode is formed in a lower portion, when the diodes are upside down and assembled to the package board 1000, the horizontal structure type diode or the vertical structure type diode may not operate, and the operation reliability thereof may be degraded.

In a semiconductor device according to embodiments of the present disclosure, since the first and second conductivity type electrodes are provided in the upper portion thereof and the first and second conductivity type electrodes are also provided in the lower portion thereof, even when the semiconductor device is assembled upside down to the package board 1000, the operational reliability of the display device is enhanced.

Also, since the semiconductor device has a symmetrical shape and is assembled to the package board 1000 by using the n type and p type electrodes formed in the upper and lower portions of the semiconductor device, the time for assembling the semiconductor device to the package board 1000 is shortened. Thus, the productivity of a display device is enhanced.

In particular, a defect (a degradation of assembly yield) that an empty region is generated as the semiconductor device is not assembled to the package board 1000 is reduced, and the first conductivity type electrode 300 and the second conductivity type electrode 400 of the semiconductor device are arranged irrespective of left and right sides, as well as irrespective of upper and lower sides, and the semiconductor device are installed on the package board 1000 at a fast assembling rate, increasing the productivity.

In addition, a plurality of semiconductor devices according to embodiments of the present disclosure may have various symmetrical shapes, respectively, and may be differentiated such that particular semiconductor devices are installed in particular recess portions 600, respectively. For example, a semiconductor device having a dodecagonal planar shape can be inserted into a recess portion 600 with a bottom surface having a dodecagonal shape, and a semiconductor device having a circular planar shape may be inserted into a recess portion 600 with a bottom surface having a circular shape, whereby display devices capable of emitting light in various colors can be produced.

Hereinafter, a method for manufacturing the semiconductor device of FIG. 1 will be described. In particular, FIGS. 8, 9, 11, 13, 15, 17, 19, 20, 22, 24, 26, and 28 are cross-sectional views illustrating a method of manufacturing a semiconductor device according to embodiments of the present disclosure, and FIGS. 10, 12, 14, 16, 18, 21, 23, 25, 27, and 29 are plan views illustrating a method of manufacturing a semiconductor device.

Figure 8:
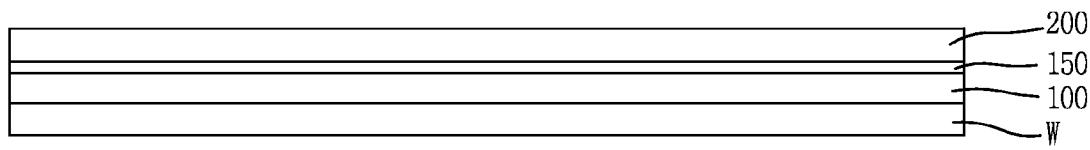
FIGS. 8, 9, 11, 13, 15, 17, 19, 20, 22, 24, 26, and 28 are cross-sectional views illustrating a method of manufacturing a semiconductor device according to embodiments of the present disclosure.

Referring to FIG. 8, a first conductivity type semiconductor layer 100, an active layer 150, and a second conductivity type semiconductor layer 200 are grown on a substrate W. The substrate W may be a sapphire ($Al_2O_3$) substrate or a spinel ($MgAl_2O_4$) substrate. Also, the substrate W may be a substrate including SiC, Si, ZnO, GaAs, or GaN. Alternatively, the substrate W may be a conductive substrate such as a metal substrate.

The substrate W may be a substrate for growing the first conductivity type semiconductor layer 100, the active layer 150, and the second conductivity type semiconductor layer 200. Here, preferably, a substrate having a crystal lattice constant and coefficient of thermal expansion equal to or similar to those of the first and second conductivity type semiconductor layers 100 and 200 may be selectively used as the substrate W. For example, when the first and second conductivity type layers 100 and 200 include a GaN-based semiconductor material, the substrate W may be a GaN substrate, sapphire substrate, or a SiC substrate.

The first conductivity type semiconductor layer 100 and the second conductivity type semiconductor layer 200 may include a GaN-based semiconductor material, a ZnO-based semiconductor material, a GaAS-based semiconductor material, a GaP-based semiconductor material, or a GaAsP-based semiconductor material. Also, the first conductivity type semiconductor layer 100 and the second conductivity type semiconductor layer 200 may be formed as an n type semiconductor layer and a p type semiconductor layer, respectively.

The n type semiconductor layer may include impurities such as silicon (Si), germanium (Ge), selenium (Se), tellurium (Te), carbon (C), and the like, to have a plurality of free electrons. The p type semiconductor layer may include impurities such as manganese (Mg), zinc (Zn), or beryllium (Be), and the like, to have a plurality of holes.

The active layer 150 may be formed to provide a region in which the free electrons included in the first conductivity type 100 and holes included in the second conductivity type semiconductor layer 200 are combined. For example, when the first and second conductivity type semiconductor layers 100 and 200 are formed to include a GaN-based semiconductor material, the active layer 150 may be formed to include an InGaN-based semiconductor material. Also, in order to adjust a wavelength of emitted light, that is, a color of light, the active layer 150 may include AlGaAs, GaAsP, GaP, SiC, InGaAlP, or InGaN.

In embodiments of the present disclosure, the first and second conductivity type semiconductor layers 100 and 200 can be grown using a molecular beam epitaxy (MBE) method, a metal organic chemical vapor deposition (MOCVD) method, a hydride vapor phase epitaxy (HVPE) method, or a physical vapor deposition (PVD) method, and the like. Also, before growing the first conductivity type semiconductor layer 100, a buffer layer can be grown. When a crystal lattice constant of the substrate W and a crystal lattice constant of the first conductivity type semiconductor layer 100 are different, the buffer layer can be first grown on the substrate W and the first conductivity type semiconductor layer 100 may be grown on the buffer layer.

Figure 9:
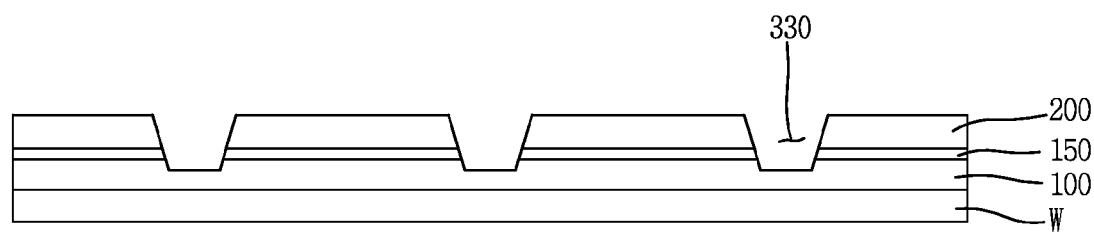

Subsequently, referring to FIGS. 9 and 10, a portion of the second conductivity type semiconductor layer 200 and a portion of the active layer 150 are etched such that the first conductivity type semiconductor layer 100 is exposed, and an electrode hole 330 may be formed. In embodiments of the present disclosure, in order to form the electrode hole 330, a photoresist mask can be formed on the second conductivity type semiconductor layer 200 and a portion of the second conductivity type semiconductor layer 200 and a portion of the active layer 150 can be etched by using an etching gas.

Thereafter, the photoresist mask can be removed through an ashing process using plasma and a wet cleaning process using an organic solvent capable of cleaning the photoresist. Also, the electrode hole 330 can be formed by penetrating through the second conductivity type semiconductor layer 200 and the active layer 150 and removing a portion of the first conductivity type semiconductor layer 100. Thereafter, a first conductivity type upper electrode portion 320 (please refer to FIG. 17) as described hereinafter can be formed such that at least a portion thereof is surrounded by the first conductivity type semiconductor layer 100.

Figure 10:
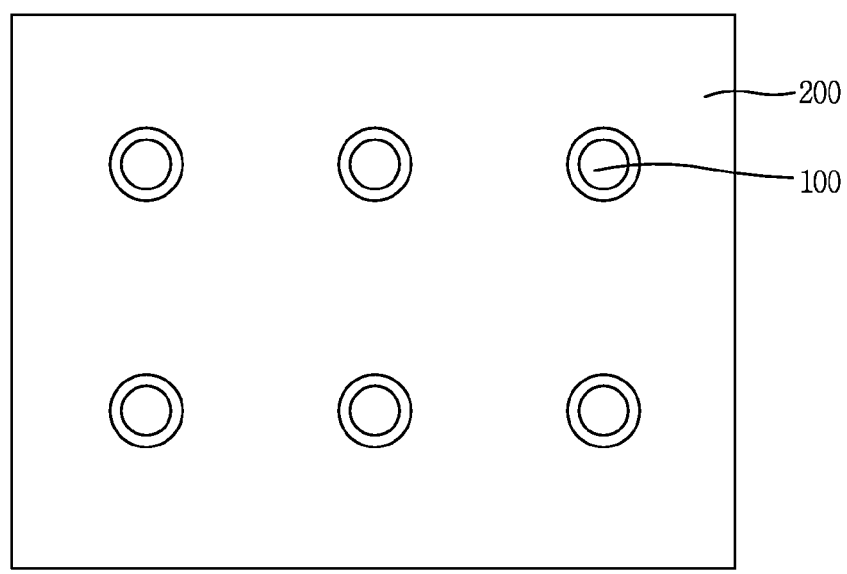
FIGS. 10, 12, 14, 16, 18, 21, 23, 25, 27, and 29 are plan views illustrating a method of manufacturing a semiconductor device.

In FIG. 10, six electrode holes 330 are illustrated, but the present disclosure is not limited thereto. For example, the number of the electrode holes 330 can be variously adjusted according to the number of semiconductor devices intended to be manufactured. Also, FIG. 10 illustrates a side surface of the electrode hole 330 is not perpendicular to an upper surface of the substrate W. However, according to a process of forming the electrode hole 330, the side surface of the electrode hole 330 can be substantially perpendicular to the upper surface of the substrate W.

Figure 11:
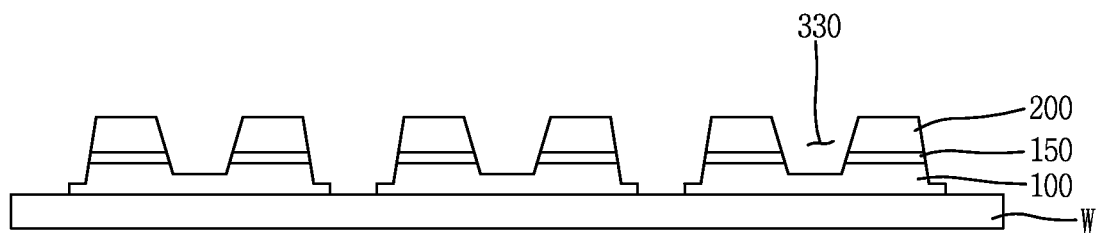
Figure 12:
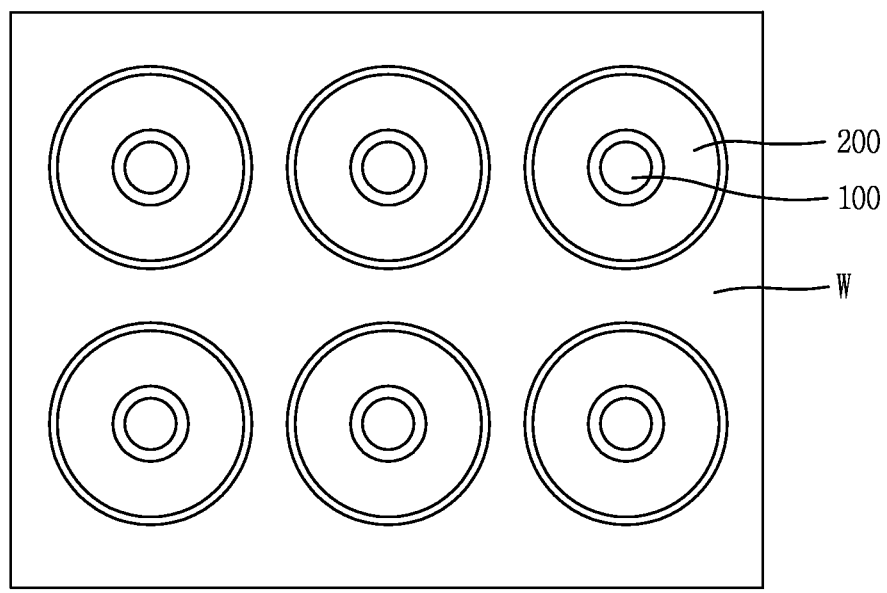

Subsequently, referring to FIGS. 11 and 12, a portion of the first conductivity type semiconductor layer 100, a portion of the active layer 150, and a portion of the second conductivity type semiconductor layer 200 are etched to demarcate (divide or isolate) the first and second conductivity type semiconductor layers 100 and 200 to form a plurality of preliminary devices. For example, a mask can be formed on the second conductivity type semiconductor layer 200 and a portion of the first conductivity type semiconductor layer 200, a portion of the active layer 150, and a portion of the second conductivity type semiconductor layer 200 can be etched using an etching gas. The mask can be a hard mask or a photoresist. Thereafter, the mask can be removed using an ashing process using plasma or a wet cleaning process using an organic solvent.

Figure 13:
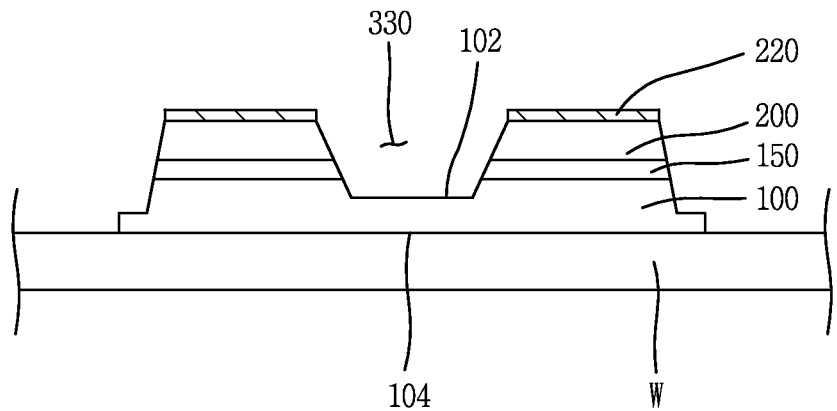
Figure 14:
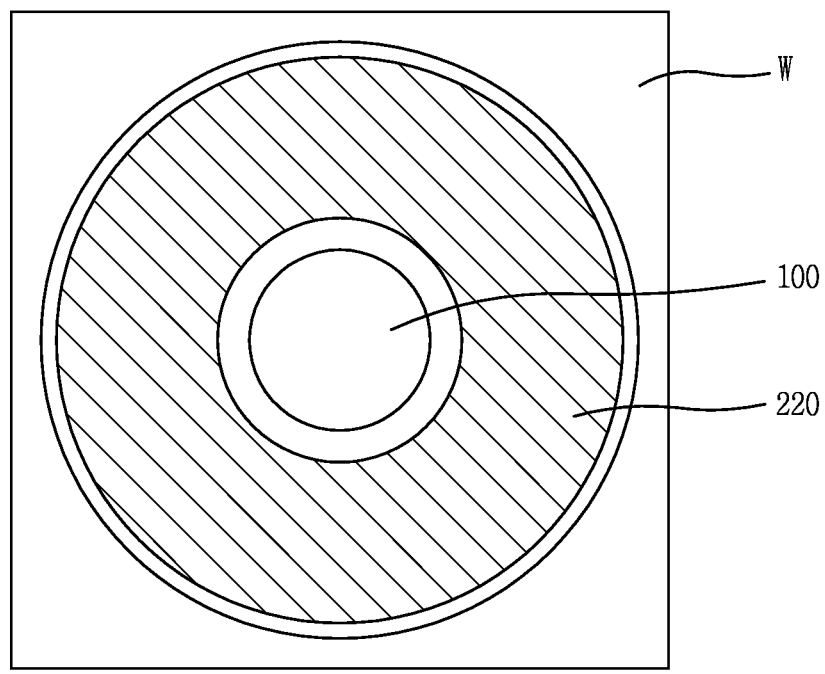

Hereinafter, a single preliminary semiconductor device in the method of manufacturing a semiconductor device will be described in detail. Referring to FIGS. 13 and 14, a transparent electrode layer 220 is stacked on the second conductivity type semiconductor layer 200. The transparent electrode layer 220 can be formed to include indium tin oxide (ITO). The transparent electrode layer 220 can serve to allow a current to be evenly distributed within the second conductivity type semiconductor layer 200. For example, the transparent electrode layer 220 can be deposited on the second conductivity type semiconductor layer 200 through a chemical vapor deposition (CVD) method, a physical vapor deposition (PVD) method, a sputtering method, and the like.

Figure 15:
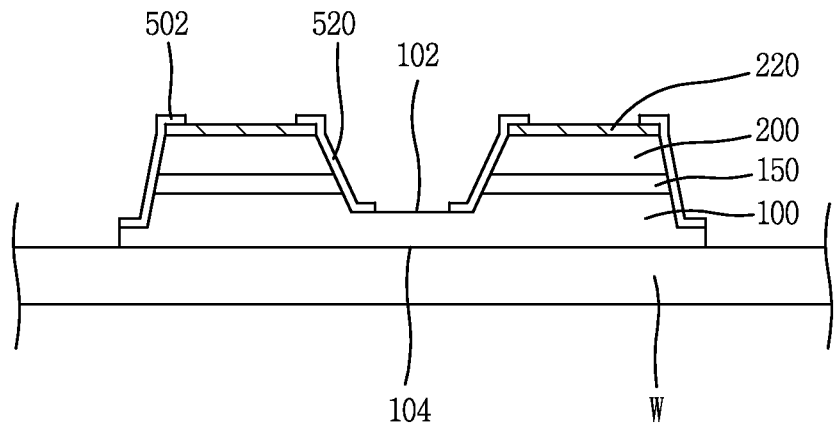
Figure 16:
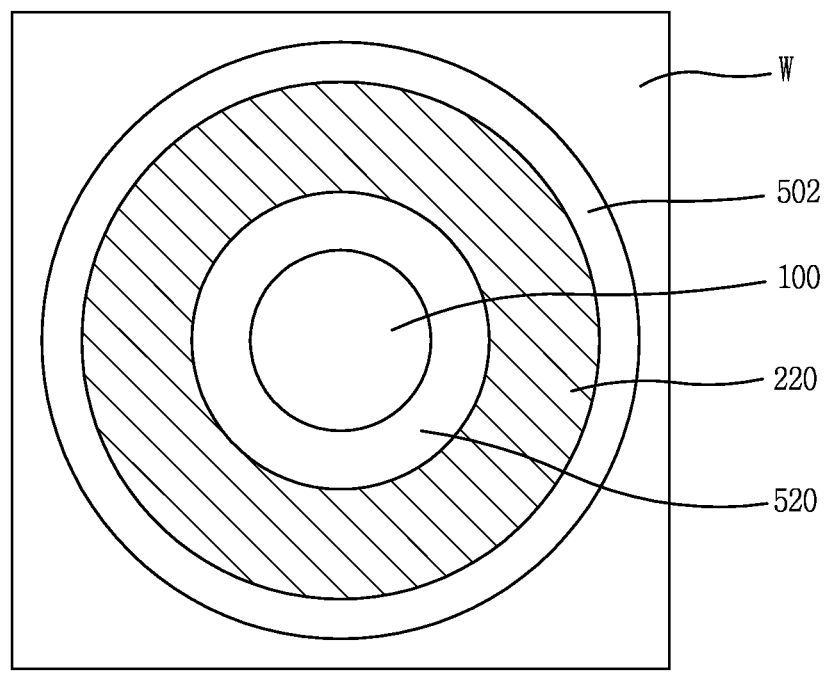

Thereafter, referring to FIGS. 15 and 16, a first preliminary insulating layer 502 can be formed to cover side surfaces of the first and second conductivity type semiconductor layers 100 and 200 and a side surface of the active layer 150. Also, a second insulating layer 520 covering at least a portion of a side surface of the electrode hole 330 can be formed. For example, the first preliminary insulating layer 502 and the second insulating layer 520 can be formed by performing a CVD method. The first preliminary insulating layer 502 can insulate a second conductivity type electrode connection portion 450 as described hereinafter from the first and second conductivity type semiconductor layers 100 and 200.

Also, the second insulating layer 520 reduces a leakage current flowing between the first conductivity type upper electrode portion 320 and a second conductivity type upper electrode portion 420 (see FIG. 17) as described hereinafter, and the second insulating layer 520 accommodates the first conductivity type upper electrode portion 320 therein.

Figure 17:
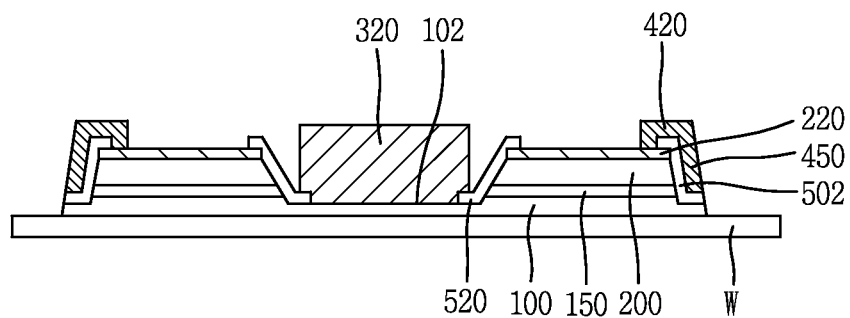
Figure 18:
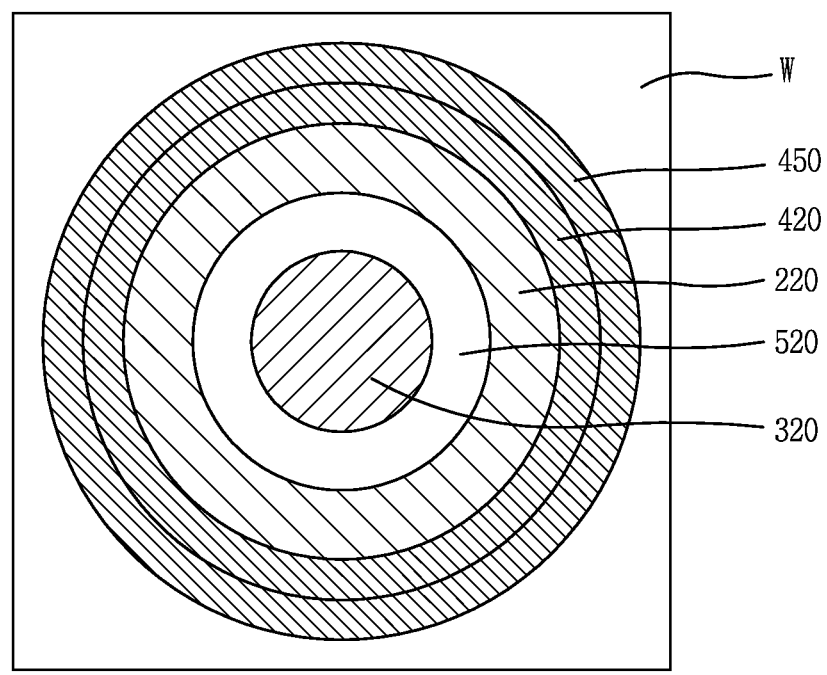

Thereafter, referring to FIGS. 17 and 18, the first conductivity type upper electrode portion 320 is formed on one surface 102 of the first conductivity type semiconductor layer 100 exposed by the electrode hole 330, and the second conductivity type upper electrode portion 420 is formed on the second conductivity type semiconductor layer 200. Also, a second conductivity type electrode connection portion 450 connected to the second conductivity type upper electrode portion 420 and extending along a side surface of the active layer 150, a side surface of the first conductivity type semiconductor layer 100, and a side surface of the second conductivity type semiconductor layer 200 is formed.

In one embodiment, the formation of the second conductivity type electrode connection portion 450 can be formation of the electrode connection portion on a side surface of the first preliminary insulating layer 502. For example, the first conductivity type upper electrode portion 320, the second conductivity type upper electrode portion 420 and the second conductivity type electrode connection portion 450 can be formed by performing an e-beam evaporation method or a sputtering method.

The first conductivity type upper electrode portion 320, the second conductivity type upper electrode portion 420, and the second conductivity type electrode connection portion 450 can be simultaneously formed or can be sequentially formed. The first conductivity type upper electrode portion 320 can include a conductive material and can be formed as an n type electrode. For example, the first conductivity type upper electrode portion 320 can be formed to include lead (Pb), tin (Sn), gold (Au), germanium (Ge), copper (Cu), bismuth (Bi), cadmium (Cd), zinc (Zn), silver (Ag), nickel (Ni), or titanium (Ti).

Also, the first conductivity type electrode portion 320 protrudes from an upper surface of the second conductivity type semiconductor layer 200 so as to be in contact with a package board. Alternatively, the first conductivity type upper electrode portion 320 can be formed not to protrude from the upper surface of the second conductivity type semiconductor layer 200 according to shapes of a conductive member of the package board corresponding to the first conductivity type upper electrode portion 320.

The second conductivity type upper electrode portion 420 and the second conductivity type electrode connection portion 450 can include a conductive material and can be formed as a p type electrode. For example, the second conductivity type upper electrode portion 420 and the second conductivity type electrode connection portion 450 can be formed to include lead (Pb) or gold (Au).

In embodiments, referring back to FIG. 3, the second conductivity type upper electrode portion 420 extends in a circumferential direction so as to be formed on the second conductivity type semiconductor layer 200. Also, the second conductivity type electrode connection portion 450 extends in the circumferential direction so as to be formed along side surfaces of the first and second conductivity type semiconductor layers 100 and 200.

Referring back to FIG. 4, a plurality of second conductivity type upper electrodes 420 are spaced apart from one another in the circumferential direction and formed on the second conductivity type semiconductor layer 200. Also, the second conductivity type upper electrode portions 420 are formed symmetrically centered on the first conductivity type upper electrode portion 320 on the second conductivity type semiconductor layer 200. Thereafter, referring to FIG. 19, the resultant structure is turned over such that the upper surface and the lower surface of the substrate W are interchanged, and thereafter, a temporary substrate C is attached to the first conductivity type semiconductor layer 100.

Figure 19:
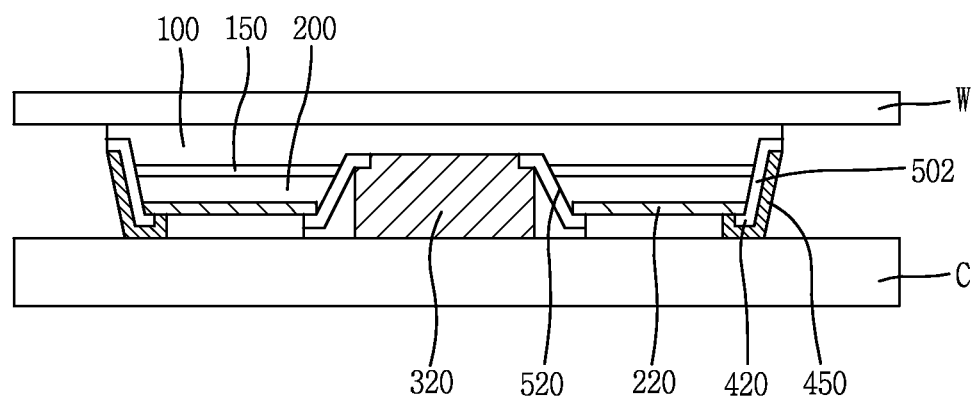

Accordingly, hereinafter, the upper surface of the first conductivity type semiconductor layer 100 of FIG. 17 can be referred to as the lower surface of the first conductivity type semiconductor layer 100 of FIG. 19, and the lower surface of the first conductivity type semiconductor layer 100 of FIG. 17 can be referred to as the upper surface of the first conductivity type semiconductor layer 100 of FIG. 19.

Thus, the temporary substrate C can be bonded to the lower surface of the first conductivity type semiconductor layer 100. The temporary substrate C can be a carrier substrate. Thereafter, after the substrate W is removed through a substrate removing process, the temporary substrate C can support the first and second conductivity type semiconductor layers 100 and 200 and follow-up processes can be performed.

Figure 20:
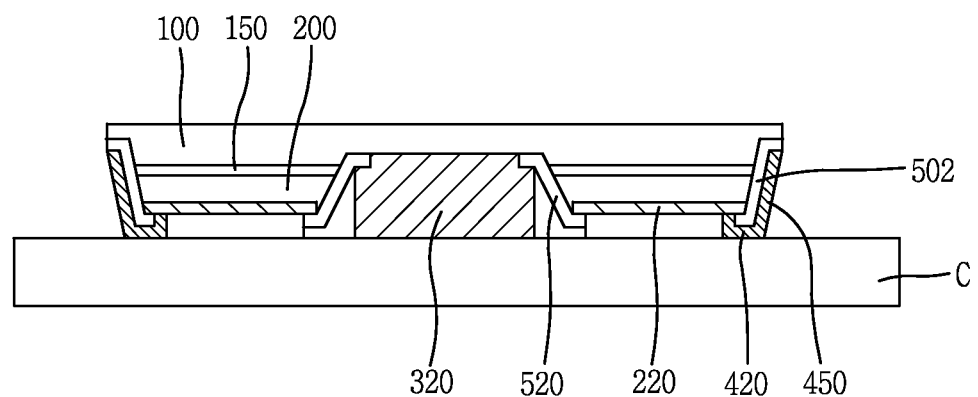
Figure 21:
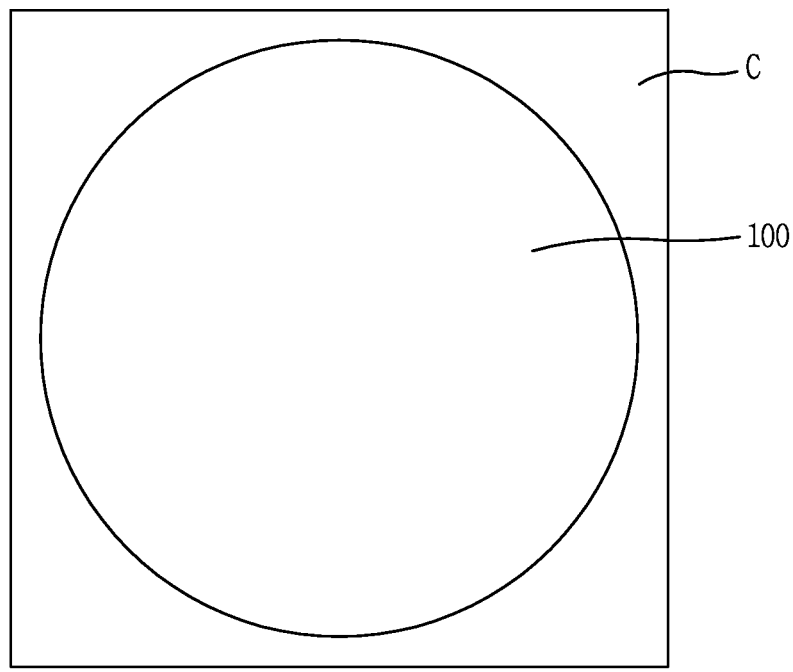
Figure 22:
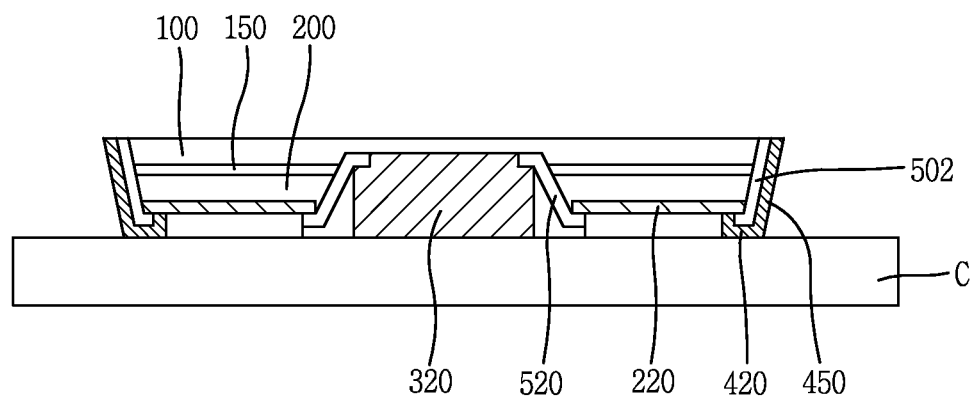
Figure 23:
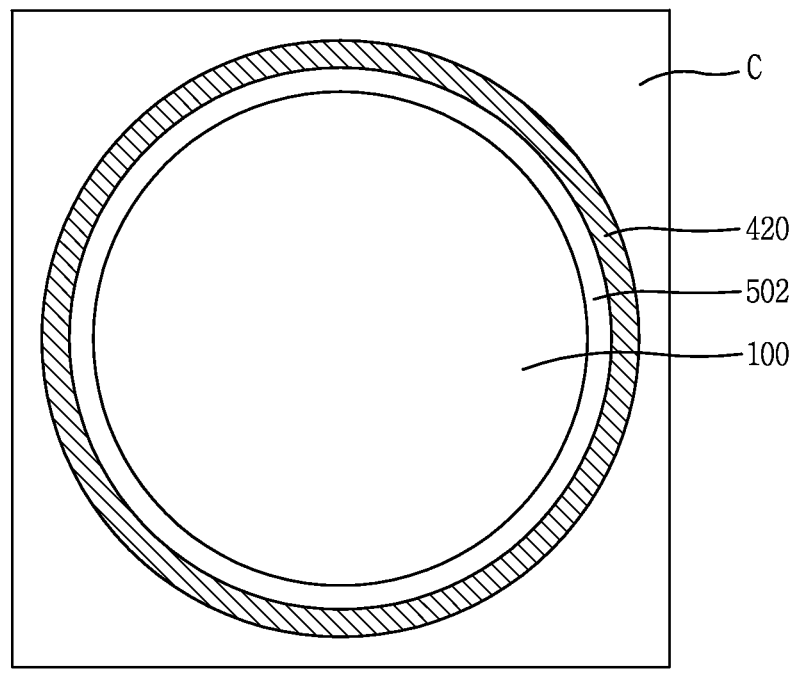

Subsequently, referring to FIGS. 20 and 21, the substrate W can be removed. For example, the substrate W can be removed by performing a laser lift off (LLO) method or a chemical lift off method. Thereafter, referring to FIGS. 22 and 23, the buffer layer can be etched to be removed. When the buffer layer has not been performed in a previous process, this process can be omitted. When the buffer layer is etched, a portion of the first conductivity type semiconductor layer 100, a portion of the first preliminary insulating layer 502, and a portion of the second conductivity type electrode connection portion 450 can also be etched to provide a flat upper surface.

Figure 24:
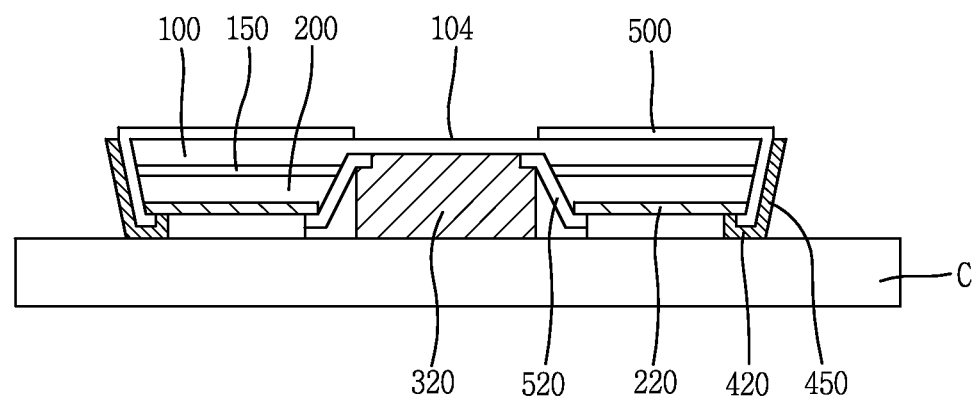
Figure 25:
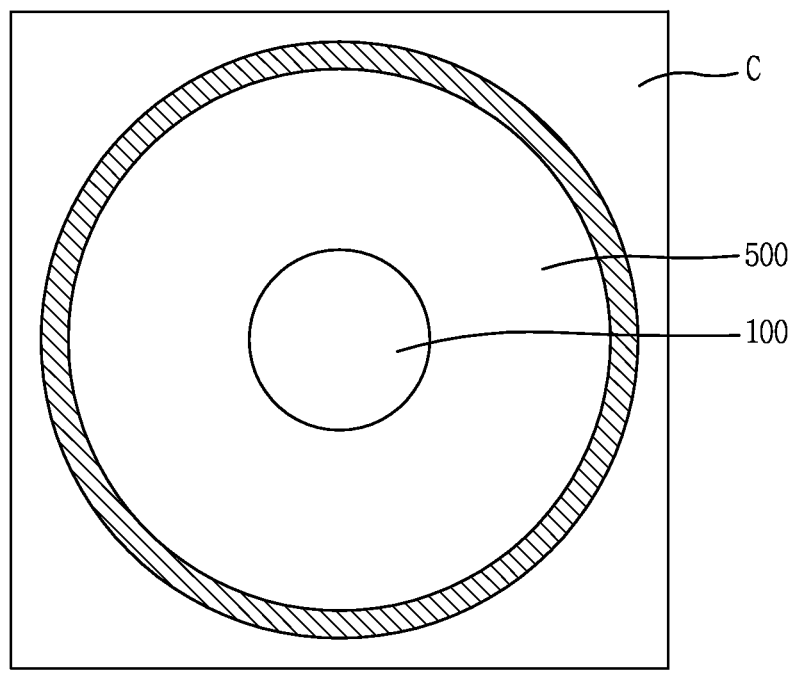

Thereafter, referring to FIGS. 24 and 25, a first insulating layer 500 is additionally formed on the other surface 104 of the first conductivity type semiconductor layer 100 such that it is connected to the first preliminary insulating layer 502. Here, the first insulating layer 500 can be formed by performing a CVD method, or the like. The first insulating layer 500 serves to insulate a second conductivity type lower electrode portion 440 as described hereinafter from the first conductivity type semiconductor layer 100.

Figure 26:
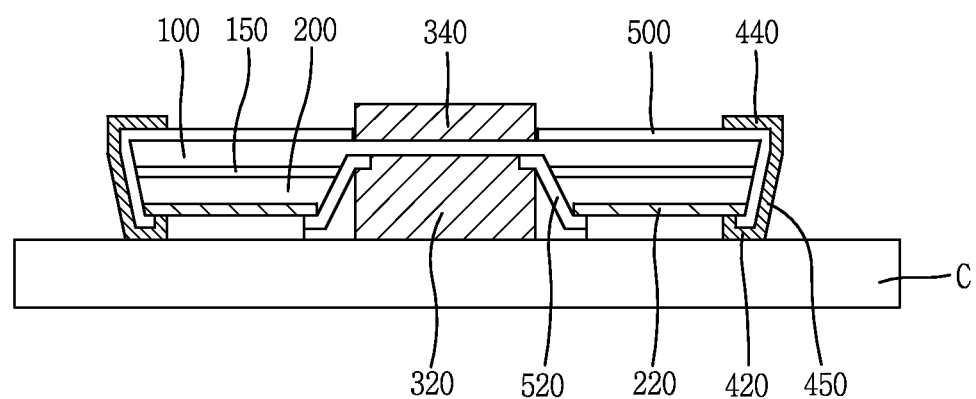
Figure 27:
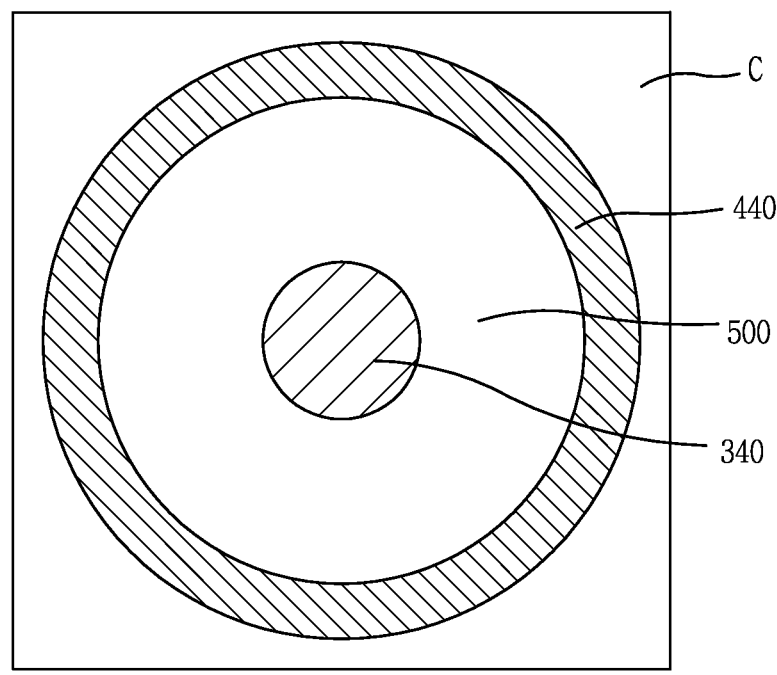

Thereafter, referring to FIGS. 26 and 27, the second conductivity type lower electrode portion 440 is formed on the first insulating layer 500 such that the second conductivity type lower electrode portion 440 is electrically connected to the second conductivity type electrode connection portion 450. Also, a first conductivity type lower electrode portion 340 can be formed on the other surface 104 of the first conductivity type semiconductor layer 100. For example, the first conductivity type lower electrode portion 340 and the second conductivity type lower electrode portion 440 can be formed by performing an e-beam evaporation method or a sputtering method.

The first conductivity type lower electrode portion 340 and the second conductivity type lower electrode portion 440 can be simultaneously formed or can be sequentially formed. The first conductivity type lower electrode portion 340 can include a conductive material and can be formed as an n type electrode. For example, the first conductivity type lower electrode portion 340 can be formed to include lead (Pb), tin (Sn), gold (Au), germanium (Ge), copper (Cu), bismuth (Bi), cadmium (Cd), zinc (Zn), silver (Ag), nickel (Ni), or titanium (Ti).

For example, the first conductivity type lower electrode portion 340 can be electrically connected to the first conductivity type upper electrode portion 320 and can be formed on the outer surface 104 of the first conductivity type 100 such that the first conductivity type lower electrode portion 340 corresponds to the first conductivity type upper electrode portion 320.

The second conductivity type lower electrode portion 440 includes a conductive material and can be formed as a p type electrode. For example, the second conductivity type lower electrode portion 440 can be formed to include lead (Pb) or gold (Au). In one embodiment, referring back to FIG. 2, the second conductivity type lower electrode portion 440 extends in a circumferential direction so as to be formed on the second conductivity type semiconductor layer 200.

Also, the second conductivity type lower electrode portion 440 can be insulated from the first conductivity type semiconductor layer 100 and can be formed to correspond to the second conductivity type upper electrode 420 on the first conductivity type semiconductor layer 100. Further, a plurality of second conductivity type lower electrodes 440 can be formed on the second conductivity type semiconductor layer 200 such that the plurality of second conductivity type lower electrodes 440 are spaced apart from one another in the circumferential direction. Also, the second conductivity type lower electrode portions 440 can be formed symmetrically centered on the first conductivity type lower electrode portion 340 on the second conductivity type semiconductor layer 200.

Figure 28:
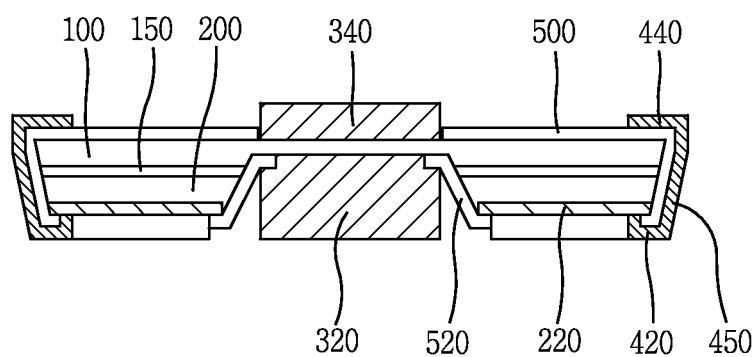
Figure 29:
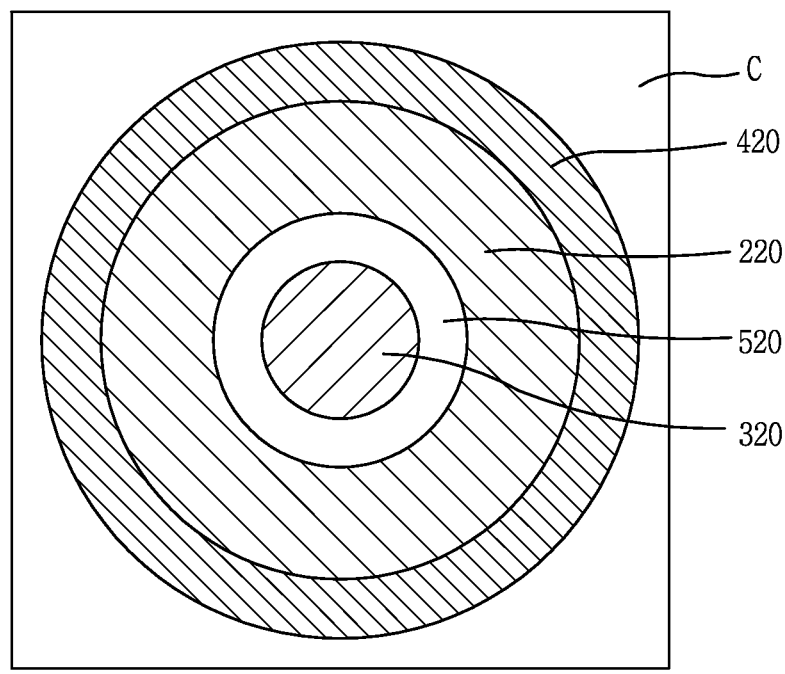

Thereafter, referring to FIGS. 28 and 29, the temporary substrate C is removed to manufacture a semiconductor device. Referring back to FIG. 5, the semiconductor device has a symmetrical shape. For example, the semiconductor device can be formed such that a shape thereof viewed from above is a circular shape or a regular polygonal shape.

In the semiconductor device according to embodiments of the present disclosure, since the semiconductor device has a symmetrical shape, assembling the semiconductor device to a package board increases. This results in an enhancing an assembling speed of the package board and the semiconductor device. Also, in the semiconductor device according to embodiments of the present disclosure, since the first and second conductivity type electrodes are formed in the upper portion thereof and the first and second conductivity type electrodes are also provided in the lower portion thereof, even when the semiconductor device is assembled upside down to the package board 1000, operational reliability of the display device is enhanced.

In particular, a defect (a degradation of assembly yield) that an empty region is generated as the semiconductor device is not assembled to the package board 1000 is reduced, and since the first conductivity type upper electrode portions 320 and 420 and the second conductivity type lower electrode portions 340 and 440 are formed, the semiconductor device can be installed on the package board 1000 irrespective of upper and lower sides and left and right sides, increasing the assembling speed.

Figure 30:
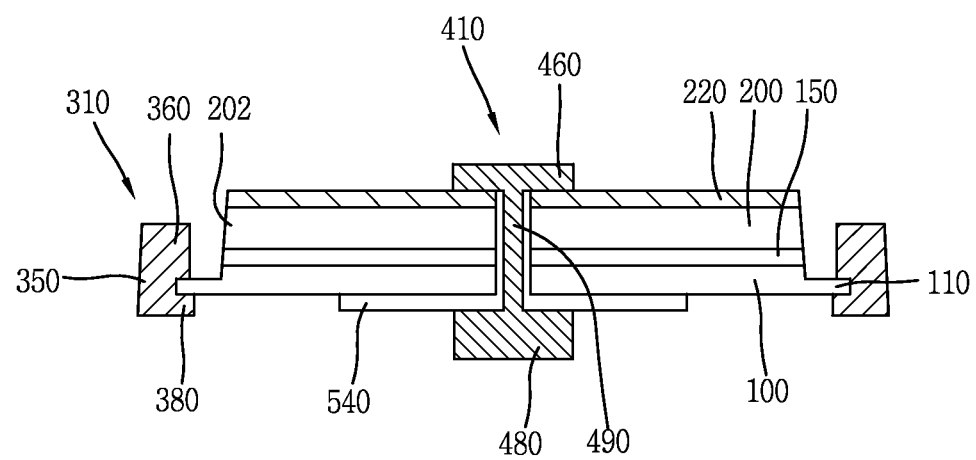
FIG. 30 is a cross-sectional view illustrating a semiconductor device according to an exemplary embodiment of the present disclosure.
Figure 31:
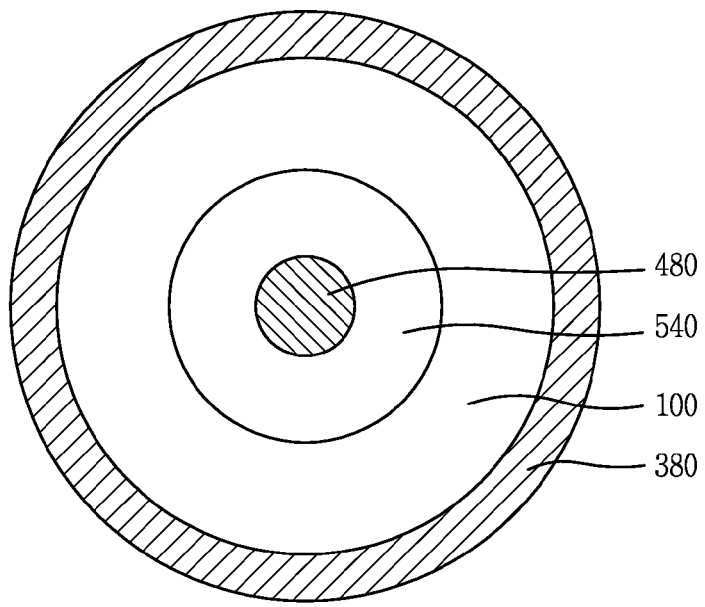
FIG. 31 is a plan view illustrating the semiconductor device of FIG. 30.

Next, FIG. 30 is a cross-sectional view illustrating a semiconductor device according to an embodiment of the present disclosure, and FIG. 31 is a plan view illustrating the semiconductor device of FIG. 30. The semiconductor device according to the present embodiment is substantially the same as the configuration of the semiconductor device of FIG. 1, except for a position and shape of an electrode connection portion and positions of a first conductivity type electrode and a second conductivity type electrode. Thus, the same reference numerals will be used for the same components and a repeated description thereof will be omitted.

Referring to FIGS. 30 and 31, a semiconductor device according to embodiments of the present disclosure includes a first conductivity type semiconductor layer 100, an active layer 150, and a second conductivity type semiconductor layer 200 which are sequentially stacked, a first conductivity type electrode 310 connected to the first conductivity type semiconductor layer 100, and a second conductivity type electrode 410 connected to the second conductivity type semiconductor layer 200.

The first conductivity type electrode 310 includes a first conductivity type upper electrode portion 360 and a first conductivity type lower electrode portion 380 disposed to correspond to each other with the first conductivity type semiconductor layer 100 interposed therebetween, and a first conductivity type electrode connection portion 350 electrically connecting the first conductivity type upper electrode portion 360 and the first conductivity type lower electrode portion 380. The second conductivity type electrode 410 includes a second conductivity type upper electrode portion 460 and a second conductivity type lower electrode portion 480 disposed to correspond to each other with the first and second conductivity type semiconductor layers 100 and 200 interposed therebetween.

The first conductivity type semiconductor layer 100 and the second conductivity type semiconductor layer 200 can be an n type semiconductor layer and a p type semiconductor layer, respectively. Also, the n type semiconductor layer can include impurities such as silicon (Si), germanium (Ge), selenium (Se), tellurium (Te), carbon (C), and the like, to have a plurality of free electrons. The p type semiconductor layer can include impurities such as manganese (Mg), zinc (Zn), or beryllium (Be), and the like, to have a plurality of holes.

The active layer 150 is interposed between the first conductivity type semiconductor layer 100 and the second conductivity type semiconductor layer 200 and provides a region in which the free electrons included in the first conductivity type semiconductor layer 100 and the holes included in the second conductivity type semiconductor layer 200.

The first conductivity type electrode 310 is in contact with the first conductivity type semiconductor layer 100 and supplies free electrons to the first conductivity type semiconductor layer 100. The first conductivity type electrode 310 includes a conductive material. Also, the first conductivity type electrode 310 can be an n type electrode. For example, the first conductivity type electrode 310 can include lead (Pb), tin (Sn), gold (Au), germanium (Ge), copper (Cu), bismuth (Bi), cadmium (Cd), zinc (Zn), silver (Ag), nickel (Ni), or titanium (Ti).

The second conductivity type electrode 410 is in contact with the second conductivity type semiconductor layer 200 and supplies holes to the second conductivity type semiconductor layer 200. The second conductivity type electrode 410 includes a conductive material. Also, the second conductivity type electrode 410 can be a p type electrode. For example, the second conductivity type electrode 410 can include Pb or Au.

In embodiments of the present disclosure, the first conductivity type semiconductor layer 100 further includes a protrusion portion 110 protruding from a side surface 202 of the second conductivity type semiconductor layer 200. The first conductivity type upper electrode portion 360 and the first conductivity type lower electrode portion 380 are disposed to correspond to each other with the protrusion portion 110 interposed therebetween. For example, the first conductivity-type electrode 310 including the first conductivity type upper electrode portion 360 is disposed on the protrusion portion 110 and spaced apart from the second conductivity type semiconductor layer 200 and the active layer 150 and the first conductivity type lower electrode portion 380 is disposed below the protrusion portion 110.

Also, the first conductivity type electrode connection portion 350 extends along a side surface of the protrusion portion 110 and electrically connects the first conductivity type upper electrode portion 360 and the first conductivity type lower electrode portion 380. The second conductivity type electrode 410 includes the second conductivity type upper electrode portion 460 disposed on the second conductivity type semiconductor layer 200, the second conductivity type lower electrode portion 480 disposed below the first conductivity type semiconductor layer 100 such that the second conductivity type lower electrode portion 480 corresponds to the second conductivity type upper electrode portion 460, and a second conductivity type electrode connection portion 490 electrically connecting the second conductivity type upper electrode portion 460 and the second conductivity type lower electrode portion 480.

The second conductivity type upper electrode portion 460 is disposed on the second conductivity type semiconductor layer 200 and supplies holes to the second conductivity type semiconductor layer 200. In embodiments of the present disclosure, the semiconductor device further includes a transparent electrode layer 220 stacked on the second conductivity type semiconductor layer 200. For example, the transparent electrode layer 220 can include indium tin oxide (ITO).

Also, the second conductivity type upper electrode portion 460 is disposed on the transparent electrode layer 220. The transparent electrode layer 220 allows a current to be evenly injected from the second conductivity type upper electrode portion 460 to the second conductivity type semiconductor layer 200. The second conductivity type lower electrode portion 480 is insulated from the first conductivity type semiconductor layer 100 and disposed below the first conductivity type semiconductor layer 100 such that the second conductivity type lower electrode layer 480 corresponds to the second conductivity type upper electrode portion 460

Also, the second conductivity type electrode connection portion 490 electrically connects the second conductivity type upper electrode portion 460 and the second conductivity type lower electrode portion 480. For example, the second conductivity type electrode connection portion 490 extends by penetrating the active layer 150 and the first and second conductivity type semiconductor layers 100 and 200 and is insulated from the active layer 150 and the first and second conductivity type semiconductor layers 100 and 200.

In one embodiment, the semiconductor device further includes a third insulating layer 540 interposed between the second conductivity type electrode connection portion 490 and the second conductivity type lower electrode portion 480 and the active layer 150 and the first and second conductivity type semiconductor layers 100 and 200. The third insulating layer 540 is interposed between the second conductivity type electrode connection portion 490 and the active layer 150 and the first and second conductivity type semiconductor layers 100 and 200 to insulate the second conductivity type electrode connection portion 490 and the first and second conductivity type semiconductor layers 100 and 200.

Also, the third insulating layer 540 is interposed between the second conductivity type lower electrode portion 480 and the first conductivity type semiconductor layer 100 to insulate the second conductivity type lower electrode portion 480 and the first conductivity type semiconductor layer 100 from each other.

In embodiments of the present disclosure, the protrusion portion 110 extends in a circumferential direction and protrudes from a side surface of the second conductivity type semiconductor layer 200. Also, the first conductivity type upper electrode portion 360 extends in the circumferential direction and is disposed on the protrusion portion 110. The first conductivity type lower electrode portion 380 also extends in the circumferential direction and is disposed below the protrusion portion 110.

Also, the first conductivity type electrode connection portion 350 extends along a side portion of the protrusion portion 110 in the circumferential direction and electrically connects the first conductivity type upper electrode portion 360 and the first conductivity type lower electrode portion 380. Alternatively, a plurality of first conductivity type upper electrode portions 360 can be provided and disposed above the protrusion portion 110 and spaced apart from one another in the circumferential direction centered around the second conductivity type upper electrode portion 460.

Also, a plurality of first conductivity type lower electrode portions 380 can be provided and disposed below the protrusion portion 110 and spaced apart from one another in the circumferential direction centered around the second conductivity type lower electrode portion 480. The first conductivity type lower electrode portions 380 can be disposed to correspond to the first conductivity type upper electrode portions, respectively.

When the first conductivity type upper and lower electrode portions 360 and 380 are spaced apart from one another in the circumferential direction, a degradation of optical efficiency that light generated by the active layer 150 is absorbed by the first conductivity type upper and lower electrode portions 360 and 380 can be reduced.

As discussed above, the semiconductor device can have a symmetrical shape. For example, when viewed from above, the semiconductor device can have a circular shape or a regular polygonal shape. According to embodiments of the present disclosure, since the semiconductor device has a symmetrical shape, the semiconductor device can be easily assembled to a package board. This results in increasing an assembling speed of the package board.

Also, since the n type electrode is disposed in the upper portion of the semiconductor device with respect to the p type electrode and the n type electrode is disposed in the lower portion of the semiconductor device with respect to the p type electrode, the semiconductor device can be installed on the package board irrespective of upper and lower sides of the semiconductor device. Thus, even though the semiconductor device is assembled upside down to the package board, the semiconductor device can be driven and the operation reliability of the display device can be secured. Also, since the n type electrode can be disposed with respect to the p type electrode, various semiconductor devices according to purposes can be provided.

Hereinafter, a method of manufacturing the semiconductor device of FIG. 30 will be described. In addition, FIGS. 32, 33, 35, 37, 39, 41, 43, 44, 46, and 48 are cross-sectional views illustrating a method of manufacturing a semiconductor device according to embodiments of the present disclosure, and FIGS. 34, 36, 38, 40, 42, 45, 47, and 49 are plan views illustrating the semiconductor device.

Figure 32:
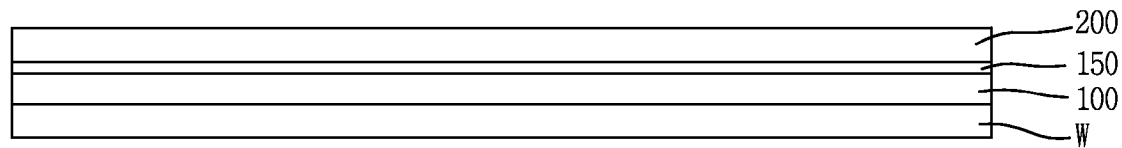
FIGS. 32, 33, 35, 37, 39, 41, 43, 44, 46, and 48 are cross-sectional views illustrating a method of manufacturing a semiconductor device according to embodiments of the present disclosure.

Referring to FIG. 32, a first conductivity type semiconductor layer 100, an active layer 150, and a second conductivity type semiconductor layer 200 are grown on a substrate W. The substrate W can be a sapphire ($Al_2O_3$) substrate or a spinel ($MgAl_2O_4$) substrate. Also, the substrate W can be a substrate including SiC, Si, ZnO, GaAs, or GaN. Alternatively, the substrate W can be a conductive substrate such as a metal substrate.

Also, the first conductivity type semiconductor layer 100 and the second conductivity type semiconductor layer 200 can be formed as an n type semiconductor layer and a p type semiconductor layer, respectively. The n type semiconductor layer can include impurities such as silicon (Si), germanium (Ge), selenium (Se), tellurium (Te), carbon (C), and the like, to have a plurality of free electrons. The p type semiconductor layer can include impurities such as manganese (Mg), zinc (Zn), or beryllium (Be), and the like, to have a plurality of holes.

The active layer 150 is interposed between the first conductivity type semiconductor layer 100 and the second conductivity type semiconductor layer 200 and provides a region in which the free electrons included in the first conductivity type 100 and holes included in the second conductivity type semiconductor layer 200 are combined.

In embodiments of the present disclosure, the first and second conductivity type semiconductor layers 100 and 200 and the active layer 150 can be grown using a molecular beam epitaxy (MBE) method, a metal organic chemical vapor deposition (MOCVD) method, a hydride vapor phase epitaxy (HVPE) method, or a physical vapor deposition (PVD) method, and the like. Also, before growing the first conductivity type semiconductor layer 100, a buffer layer can be grown. When a crystal lattice constant of the substrate W and a crystal lattice constant of the first conductivity type semiconductor layer 100 are different, the buffer layer can be first grown on the substrate W and the first conductivity type semiconductor layer 100 can be grown on the buffer layer.

Figure 33:
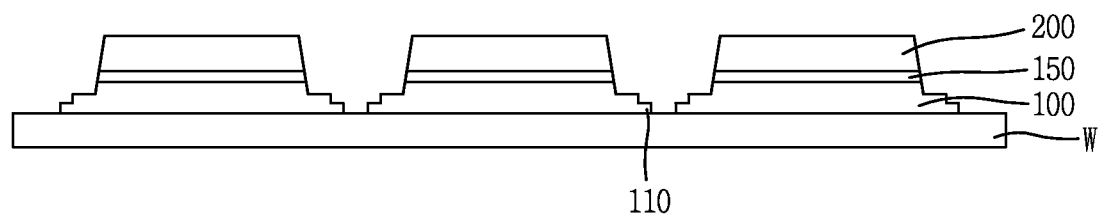

Subsequently, referring to FIGS. 33 and 34, a portion of the second conductivity type semiconductor layer 200 and a portion of the active layer 150 are etched (mesa etching) such that the first conductivity type semiconductor layer 100 is exposed. Also, a portion of the first conductivity type semiconductor layer 100 is further etched to demarcate and form a plurality of preliminary semiconductor devices (isolation etching).

For example, a photoresist mask can be formed on the second conductivity type semiconductor layer 200 and a portion of the second conductivity type semiconductor layer 200 and a portion of the active layer 150 can be etched by using an etching gas to expose the first conductivity type semiconductor layer 100. Also, a photoresist mask can be formed on the first and second conductivity type semiconductor layers 100 and 200, and the first conductivity type semiconductor layer 100 can be etched by using an etching gas to demarcate and form a plurality of preliminary semiconductor devices.

The photoresist masks can be removed through an ashing process using plasma and a wet cleaning process using an organic solvent capable of cleaning the photoresist. For example, the mesa etching and the isolation etching can be sequentially performed, or can be simultaneously performed. By performing the etching processes, the protrusion portion 110 protruding from a side surface of the second conductivity type semiconductor layer 200 can be formed. Also, the protrusion portion 110 can extend in a circumferential direction and the protrusion 110 can be formed to have side surfaces having a step.

Figure 34:
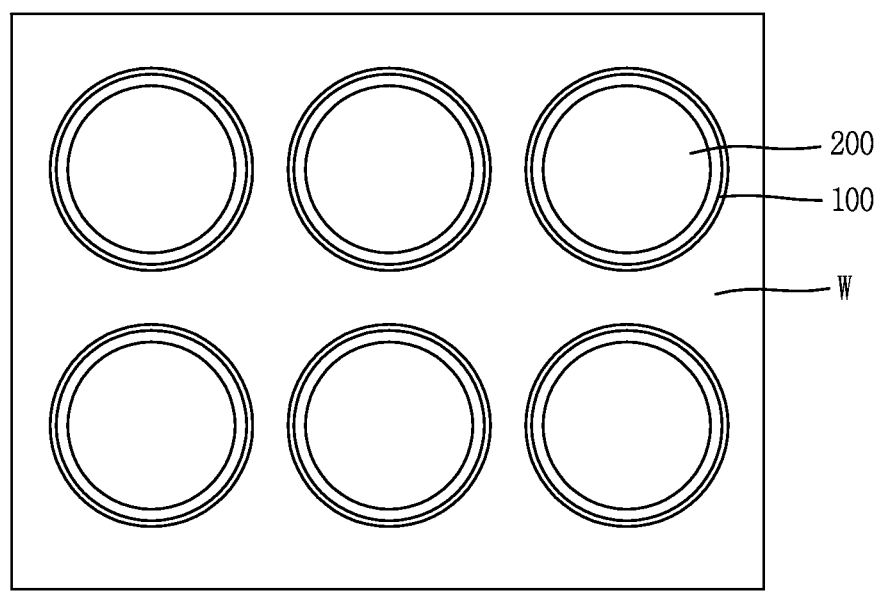
FIGS. 34, 36, 38, 40, 42, 45, 47, and 49 are plan views illustrating the semiconductor device.

FIG. 34 illustrates six preliminary semiconductor devices are formed, but the present disclosure is not limited thereto. The number of preliminary semiconductor devices can be variously adjusted according to numbers of semiconductor devices intended to be manufactured.

Figure 35:
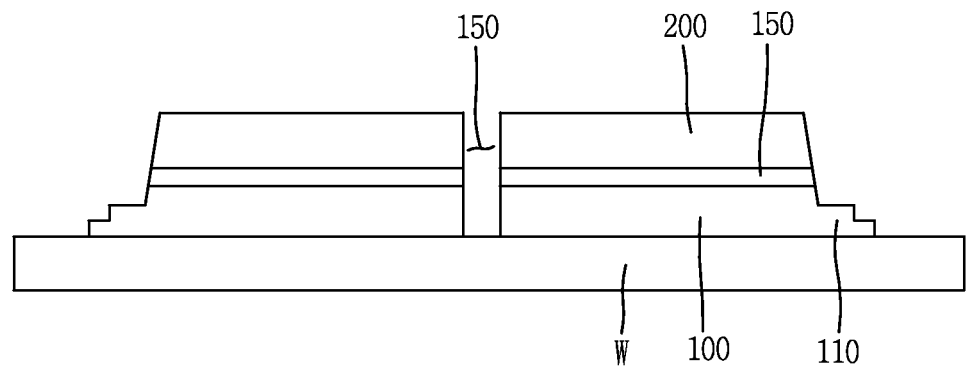
Figure 36:
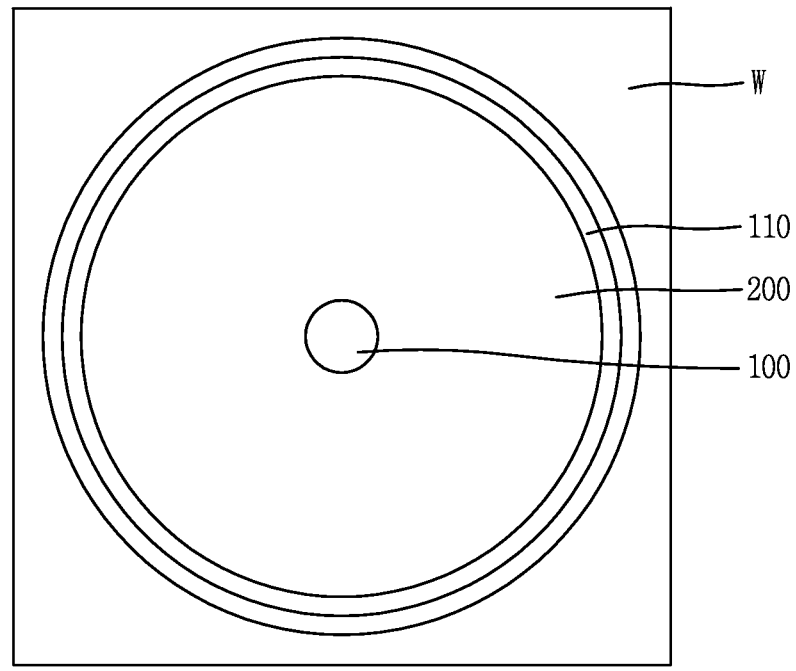

Hereinafter, a single preliminary semiconductor device will be described in detail. Referring to FIGS. 35 and 36, a through hole 150 penetrating through the first and second conductivity type semiconductor layers 100 and 200 and the active layer 150 can be formed such that one surface of the substrate W is exposed. For example, a hard mark or a photoresist mask can be formed on the second conductivity type semiconductor layer 200, and the first and second conductivity type semiconductor layers 100 and 200 can be etched using an etching gas to form the through hole 150.

Figure 37:
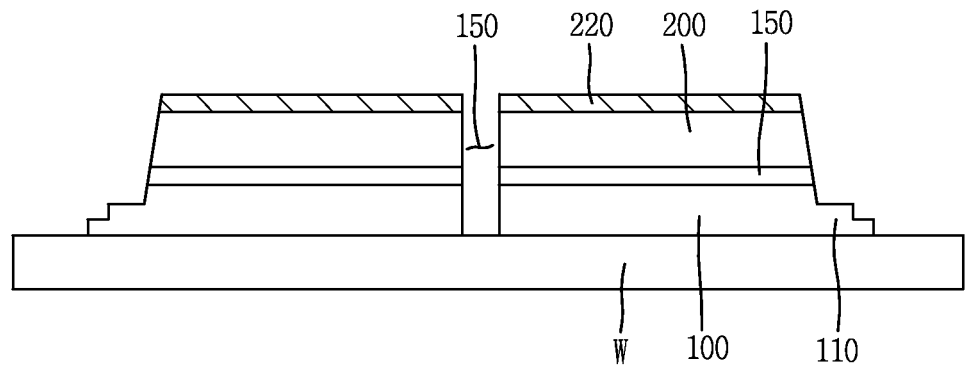
Figure 38:
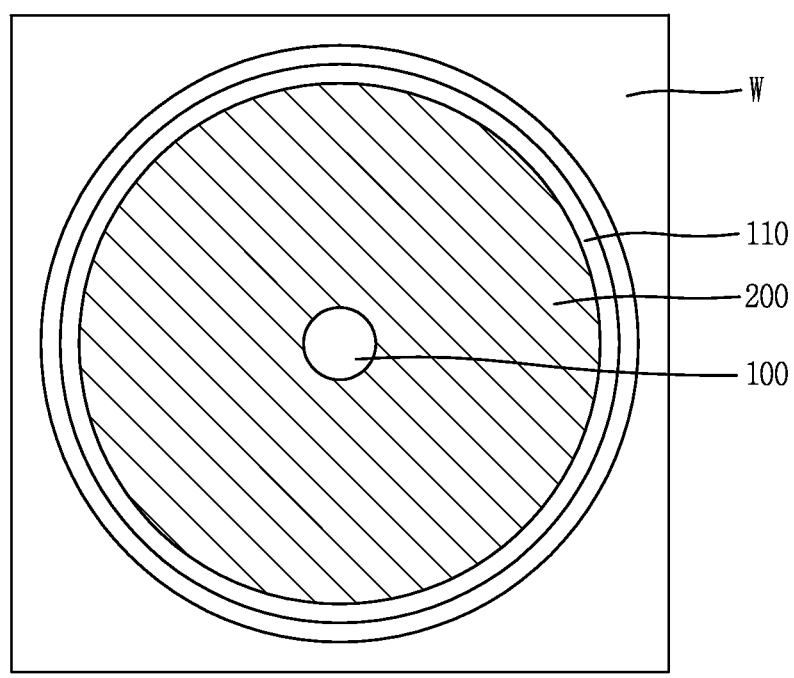

Thereafter, referring to FIGS. 37 and 38, a transparent electrode layer 220 is stacked on the second conductivity type semiconductor layer 200. The transparent electrode layer 220 can be formed to include indium tin oxide (ITO). The transparent electrode layer 220 can serve to allow a current to be evenly distributed within the second conductivity type semiconductor layer 200. For example, the transparent electrode layer 220 can be deposited on the second conductivity type semiconductor layer 200 through a chemical vapor deposition (CVD) method, a physical vapor deposition (PVD) method, a sputtering method, and the like.

Figure 39:
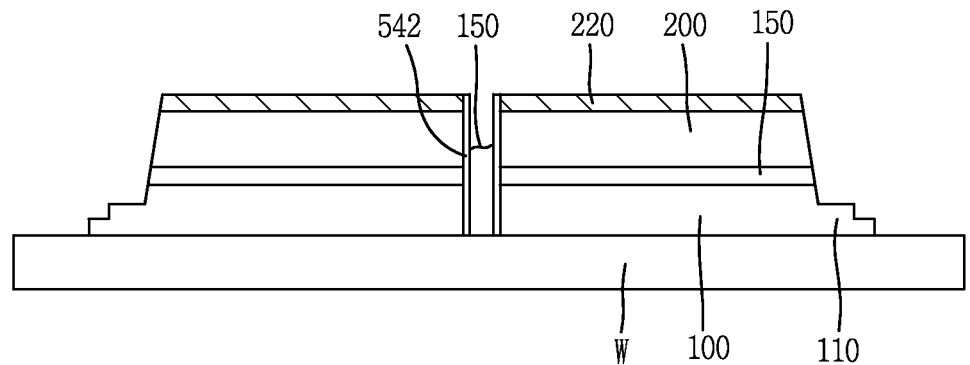
Figure 40:
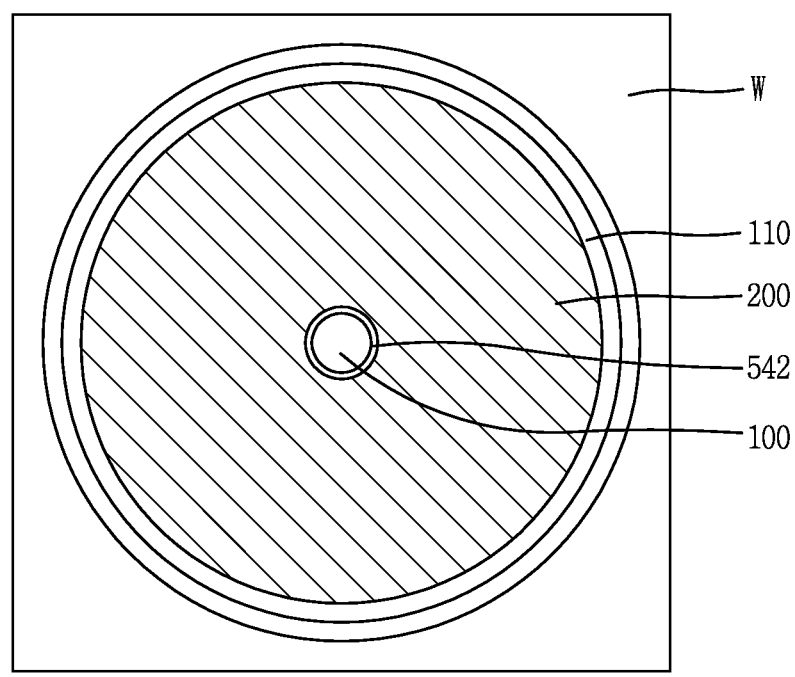

Thereafter, referring to FIGS. 39 and 40, a third preliminary insulating layer 542 can be formed to cover a side surface of the through hole 150. For example, the third preliminary insulating layer 542 can be formed by performing a CVD method. The third preliminary insulating layer 542 can insulate a second conductivity type electrode connection portion 490 as described hereinafter from the first and second conductivity type semiconductor layers 100 and 200.

Figure 41:
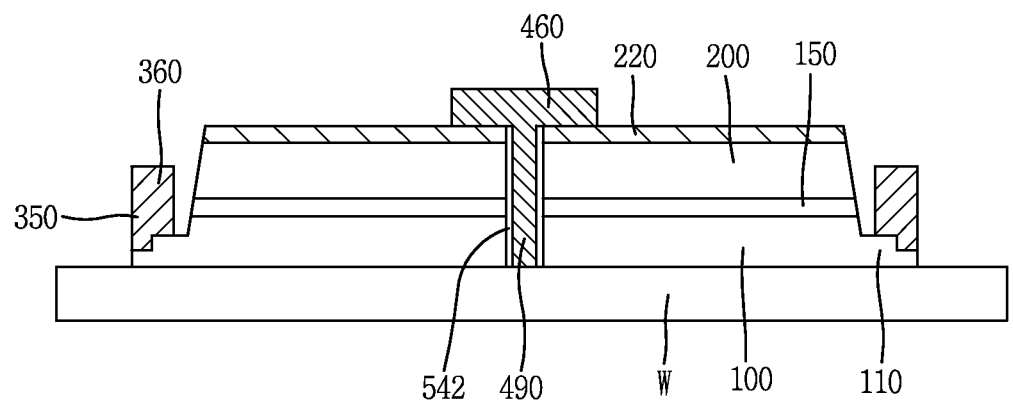

Thereafter, referring to FIGS. 40 and 41, a first conductivity type upper electrode portion 360 is formed on an upper surface of the protrusion portion 110, and a first conductivity type electrode connection portion 350 is formed on a side surface of the protrusion portion 110 such that the first conductivity type electrode connection portion 350 is electrically connected to the first conductivity type upper electrode portion 360.

Also, a second conductivity type upper electrode portion 460 is formed on the second conductivity type semiconductor layer 200, and a second conductivity type electrode connection portion 490 connected to the second conductivity type upper electrode portion 460 and extending to fill the through hole 150 is formed. For example, the first conductivity type upper electrode portion 360, the first conductivity type electrode connection portion 350, the second conductivity type upper electrode portion 460, and the second conductivity type electrode connection portion 490 can be formed by performing an e-beam evaporation method or a sputtering method.

The first conductivity type upper electrode portion 360, the first conductivity type electrode connection portion 350, the second conductivity type upper electrode portion 460, and the second conductivity type electrode connection portion 490 can be simultaneously formed or can be sequentially formed. The first conductivity type upper electrode portion 360 and the first conductivity type electrode connection portion 350 include a conductive material and can be formed as n type electrodes. For example, the first conductivity type upper electrode portion 360 and the first conductivity type electrode connection portion 350 can include lead (Pb), tin (Sn), gold (Au), germanium (Ge), copper (Cu), bismuth (Bi), cadmium (Cd), zinc (Zn), silver (Ag), nickel (Ni), or titanium (Ti).

The first conductivity type upper electrode portion 360 can be formed to protrude or can be formed not to protrude from the upper surface of the second conductivity type semiconductor layer 200 according to shapes of a conductive member of the package board corresponding to the first conductivity type upper electrode portion 360. The second conductivity type upper electrode portion 460 and the second conductivity type electrode connection portion 490 can include a conductive material and can be formed as a p type electrode. For example, the second conductivity type upper electrode portion 460 and the second conductivity type electrode connection portion 490 can be formed to include lead (Pb) or gold (Au).

In embodiments of the present disclosure, the first conductivity type upper electrode portion 360 can extend in a circumferential direction so as to be formed on the protrusion portion 110. Also, the first conductivity type electrode connection portion 350 can be formed to extend in the circumferential direction. In embodiments of the present disclosure, a plurality of first conductivity type upper electrode portions 360 can be formed on the protrusion portion 110 and spaced apart from one another in the circumferential direction. Also, the first conductivity type upper electrode portions 360 can be formed on the protrusion portion 110 symmetrically centered on the second conductivity type upper electrode portion 460.

Figure 42:
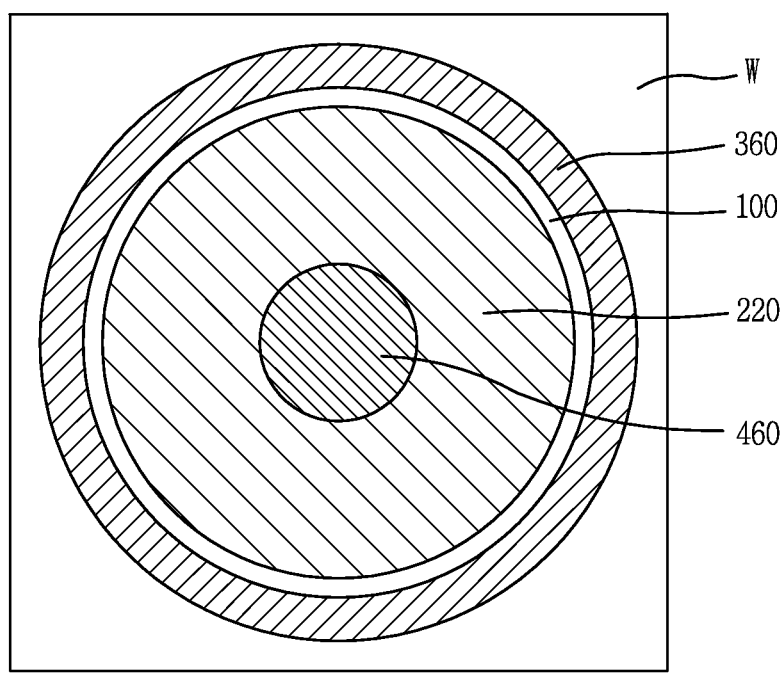

Thereafter, referring to FIG. 42, the resultant structure is turned over such that the upper surface and the lower surface of the substrate W are interchanged, and the substrate W is subsequently removed. For example, the substrate W can be removed by performing a laser lift off (LLO) method or a chemical lift off method. Before the substrate W is removed, a temporary substrate can be attached to the first conductivity type semiconductor layer 100 and a follow-up step can be performed in a state in which the temporary substrate supports the first and second conductivity type semiconductor layers 100 and 200.

Thus, hereinafter, the upper surface of the first conductivity type semiconductor layer 100 of FIG. 40 can be referred to as the lower surface of the first conductivity type semiconductor layer 100 of FIG. 42 and the lower surface of the first conductivity type semiconductor layer 100 of FIG. 40 can be referred to as the upper surface of the first conductivity type semiconductor layer 100 of FIG. 42. Thus, the temporary substrate can be bonded to the lower surface of the first conductivity type semiconductor layer 100.

Figure 43:
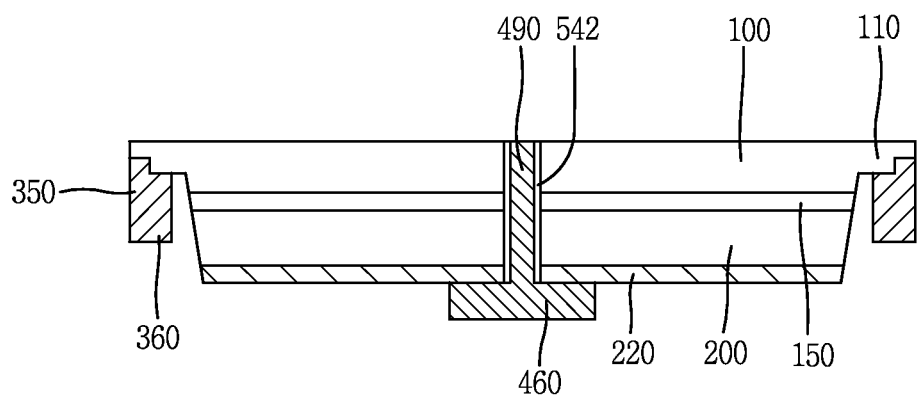
Figure 44:
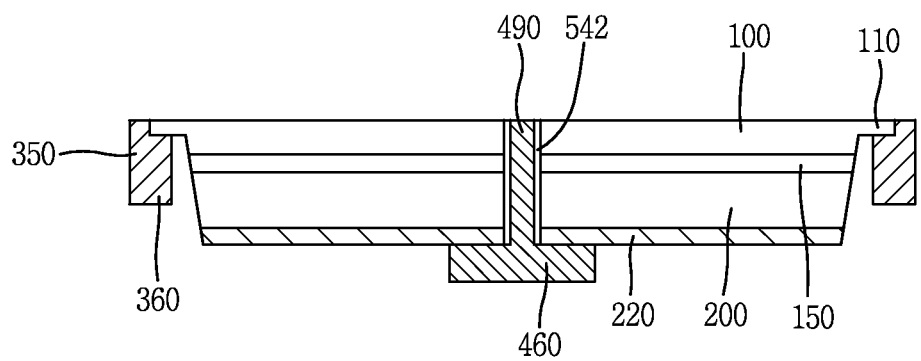

Thereafter, referring to FIGS. 43 and 44, the buffer layer can be etched to be removed. When the buffer layer has not been performed in a previous process, this process can be omitted. When the buffer layer is etched, a portion of the first conductivity type semiconductor layer 100, a portion of the third preliminary insulating layer 542, and a portion of the second conductivity type electrode connection portion 490 can also be etched to provide a flat upper surface.

Figure 45:
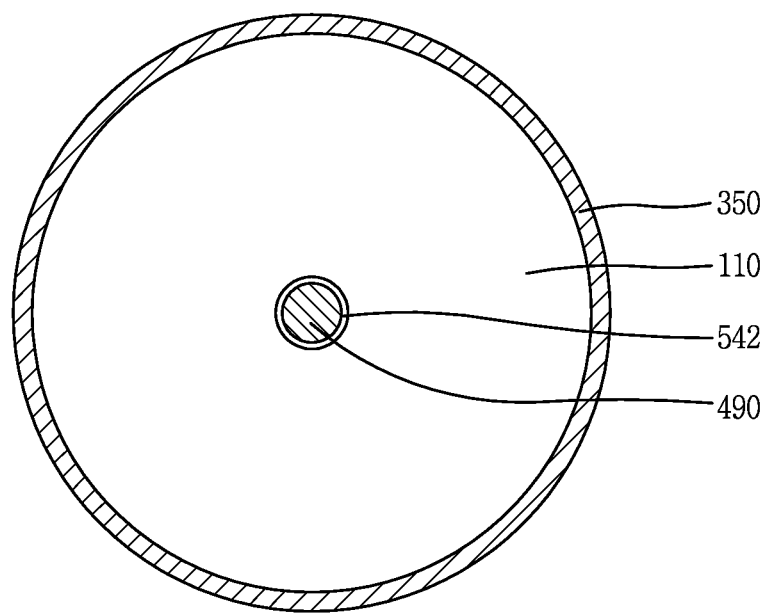
Figure 46:
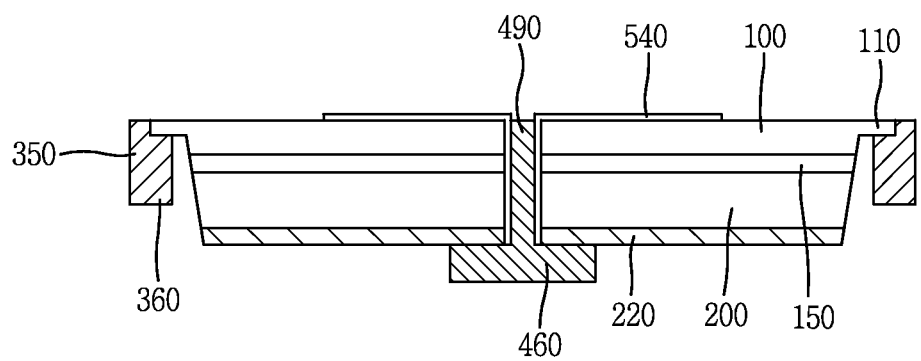

Thereafter, referring to FIGS. 45 and 46, a third insulating layer 540 is additionally formed on the first conductivity type semiconductor layer 100 such that it is connected to the third preliminary insulating layer 542. Here, the third insulating layer 540 can be formed by performing a CVD method, or the like. The third insulating layer 540 serves to insulate a second conductivity type lower electrode portion 480 as described hereinafter from the first conductivity type semiconductor layer 100.

Figure 47:
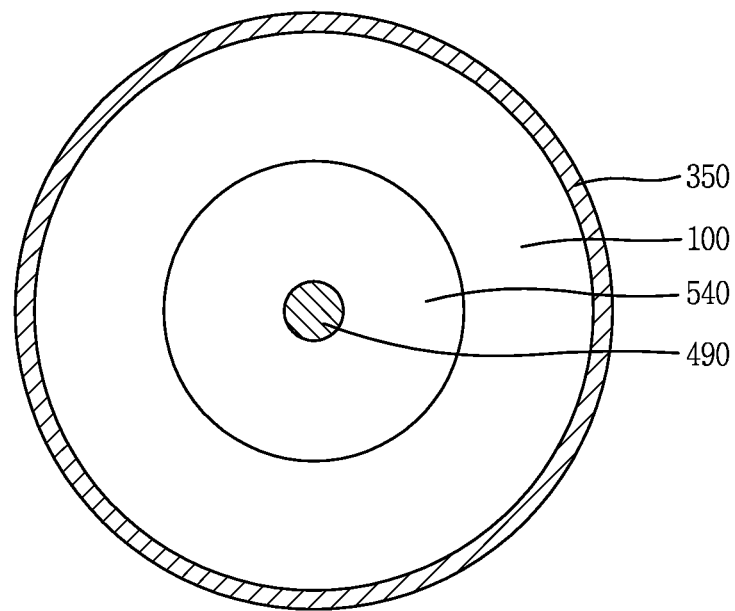
Figure 48:
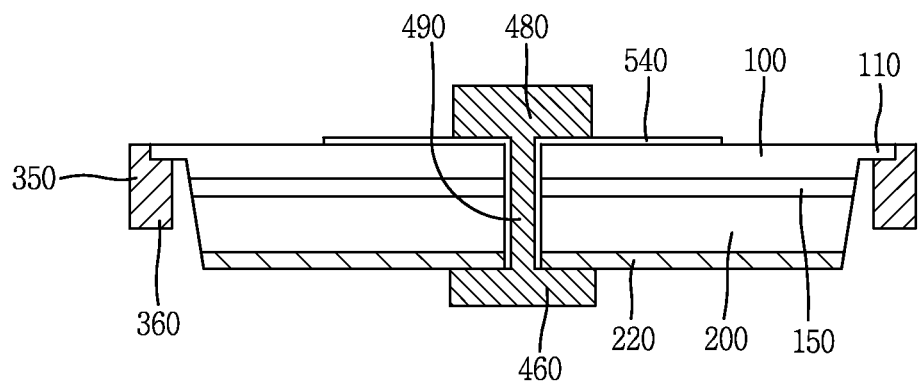
Figure 49:
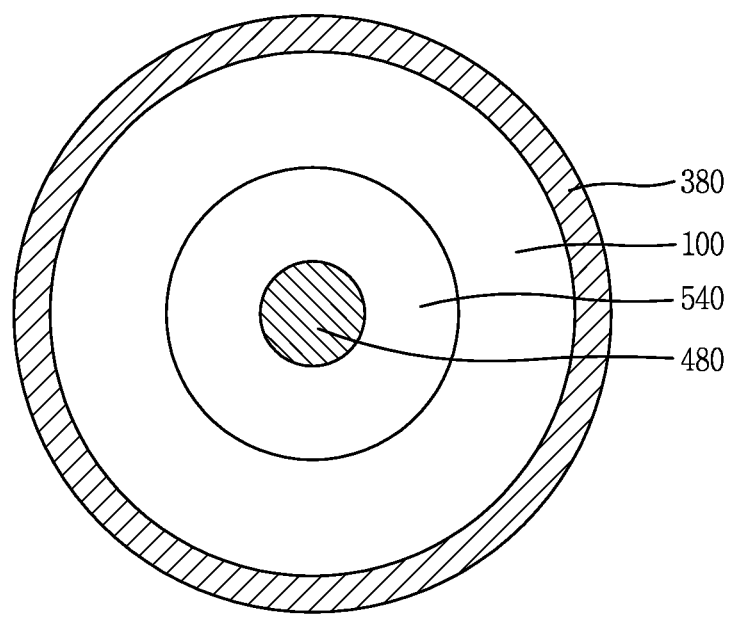

Thereafter, referring to FIGS. 47 and 48, the second conductivity type lower electrode portion 480 is formed on the third insulating layer 540 such that the second conductivity type lower electrode portion 480 is electrically connected to the second conductivity type electrode connection portion 490. Also, a first conductivity type lower electrode portion 380 can be formed on the protrusion portion 110 such that the first conductivity type lower electrode portion 380 is electrically connected to the first conductivity type electrode connection portion 350.

For example, the first conductivity type lower electrode portion 380 and the second conductivity type lower electrode portion 480 can be formed by performing an e-beam evaporation method or a sputtering method. The first conductivity type lower electrode portion 380 and the second conductivity type lower electrode portion 480 can be simultaneously formed or can be sequentially formed.

The first conductivity type lower electrode portion 380 includes a conductive material and can be formed as an n type electrode. For example, the first conductivity type lower electrode portion 380 can include lead (Pb), tin (Sn), gold (Au), germanium (Ge), copper (Cu), bismuth (Bi), cadmium (Cd), zinc (Zn), silver (Ag), nickel (Ni), or titanium (Ti). For example, the first conductivity type lower electrode portion 380 can be formed to correspond to the first conductivity type upper electrode portion 360.

The second conductivity type lower electrode portion 480 includes a conductive material and can be formed as a p type electrode. For example, the second conductivity type lower electrode portion 480 can include lead (Pb) or gold (Au). In one embodiment, the first conductivity type lower electrode portion 380 can extend in a circumferential direction so as to be formed on the protrusion portion 110.

Also, a plurality of first conductivity type lower electrode portion 380 can be formed on the protrusion portion 110 and spaced apart from one another in the circumferential direction. The first conductivity type lower electrode portion 380 can be formed on the protrusion portion 110 symmetrically centered on the second conductivity type lower electrode portion 480.

The second conductivity type lower electrode portion 480 can be insulated from the first conductivity type semiconductor layer 100 and can be formed on the first conductivity type semiconductor layer 100 such that the second conductivity type lower electrode portion 480 corresponds to the second conductivity type upper electrode portion 460. Thereafter, the temporary substrate is removed, thus manufacturing the semiconductor device. The semiconductor device can have a symmetrical shape. For example, when viewed from above, the semiconductor device can have a circular shape or a regular polygonal shape.

In the method of manufacturing a semiconductor device according to one embodiment, since a planar shape of the semiconductor device has a circular shape or a polygonal shape, assembling the semiconductor device to a package board increases. This enhances an assembling speed of the package board.

Also, since the first and second conductivity type electrodes are provided in the upper portion of the semiconductor device and the first and second conductivity type electrodes are also provided in the lower portion thereof, even when the semiconductor device is assembled upside down to the package board, the operational reliability of the display device is enhanced. In particular, since the n type electrode is disposed in the upper portion of the semiconductor device with respect to the p type electrode and the n type electrode is disposed in the lower portion of the semiconductor device with respect to the p type electrode, various semiconductor devices fitting usage purposes and environments can be manufactured.

According to the semiconductor device and manufacturing method thereof of embodiments of the present disclosure, a plurality of LED chips can be rapidly and accurately assembled to a package board. In particular, in a self-assembly method in which the LED chips and the package board are introduced to a chamber filled with a fluid and the fluid is heated to allow the LED chips to be self-assembled to the package board, each of the LED chip can have first and second conductivity type upper electrodes in an upper portion of a chip body and first and second conductivity type lower electrodes in a lower portion of the chip body, so that the upper portion of the chip body can be assembled to face the package board or the lower portion of the chip body can be assembled to face the package board.

Thus, a defect in which the LED chip is not assembled to the package board, generating an empty region, a defect in which the LED chip is assembled upside down, and the like, is reduced, enhancing the operation reliability of the display device. Also, since the LED chip has a regular polygonal shape or a circular shape having symmetry, the LED chip can be quickly assembled to the package board, enhancing productivity of the display device.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features can be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A semiconductor device comprising:
   a first conductivity type semiconductor layer, an active layer, and a second conductivity type semiconductor layer which are sequentially stacked;
   a first conductivity type upper electrode portion and a first conductivity type lower electrode portion disposed to correspond to each other with the first conductivity type semiconductor layer interposed therebetween;
   a second conductivity type upper electrode portion and a second conductivity type lower electrode portion disposed to correspond to each other with the first and second conductivity type semiconductor layers interposed therebetween; and
   a second conductivity type electrode connection portion electrically connecting the second conductivity type upper electrode portion and the second conductivity type lower electrode portion.

2. The semiconductor device of claim 1, wherein the first conductivity type semiconductor layer further includes a protrusion portion protruding from a side surface of the second conductivity type semiconductor layer,
   wherein the first conductivity type upper electrode portion and the first conductivity type lower electrode portion are disposed to correspond to each other with the protrusion portion interposed therebetween, and
   wherein the semiconductor device further includes a first conductivity type electrode connection portion electrically connecting the first conductivity type upper electrode portion and the first conductivity type lower electrode portion.

3. The semiconductor device of claim 1, wherein the second conductivity type electrode connection portion extends by penetrating through the active layer and the first and second conductivity type semiconductor layers.

4. The semiconductor device of claim 1, wherein the second conductivity type electrode connection portion extends along side surfaces of the first and second conductivity type semiconductor layers.

5. The semiconductor device of claim 1, wherein the first conductivity type upper electrode portion is disposed on one surface of the first conductivity type semiconductor layer exposed by an electrode hole penetrating through the second conductivity type semiconductor layer and the active layer.

6. The semiconductor device of claim 5, further comprising:
a first insulating layer insulating the second conductivity type lower electrode portion and the first conductivity type semiconductor layer.

7. The semiconductor device of claim 6, further comprising:
a second insulating layer at least partially covering a side surface of the electrode hole.

8. The semiconductor device of claim 5, wherein the second conductivity type upper and lower electrode portions and the second conductivity type electrode connection portion extend in a circumferential direction.

9. The semiconductor device of claim 5, wherein a plurality of second conductivity type upper electrode portions are disposed to be spaced apart from one another in a circumferential direction centered on the first conductivity type upper electrode portion, and
wherein a plurality of second conductivity type lower electrode portions are disposed to be spaced apart from one another in the circumferential direction centered on the first conductivity type lower electrode portion.

10. The semiconductor device of claim 5, wherein the electrode hole is formed by removing a portion of the first conductivity type semiconductor layer, and at least a portion of the first conductivity type upper electrode portion is surrounded by the first conductivity type semiconductor layer.

11. The semiconductor device of claim 1, wherein the semiconductor device has a symmetrical shape.

12. The semiconductor device of claim 1, further comprising:
a transparent electrode layer stacked on the second conductivity type semiconductor layer,
wherein the second conductivity type upper electrode portion is provided on the transparent electrode layer.

13. A method of manufacturing a semiconductor device, the method comprising:
growing a first conductivity type semiconductor layer, an active layer, and a second conductivity type semiconductor layer sequentially stacked on a substrate;
etching portions of the first and second conductivity type semiconductor layers and the active layer to demarcate the first and second conductivity type semiconductor layers and the active layer;
forming first and second conductivity type upper electrode portions on one surface of the first and second conductivity type semiconductor layers, respectively, and forming a second conductivity type electrode connection portion connected to the second conductivity type upper electrode portion; and
forming a first conductivity type lower electrode portion and a second conductivity type lower electrode portion connected to the second conductivity type electrode connection portion on the other surface opposing the one surface of the first conductivity type semiconductor layer.

14. The method of claim 13, wherein the forming of the first conductivity type upper electrode portion, the second conductivity type upper electrode portion, and the second conductivity type electrode connection portion further includes:
forming a first preliminary insulating layer covering side surfaces of the first and second conductivity type semiconductor layers,
wherein the forming of the second conductivity type electrode connection portion includes forming the electrode connection portion on a side surface of the first preliminary insulating layer.

15. The method of claim 14, wherein the forming of the second conductivity type lower electrode portion further includes:
additionally forming a first insulating layer on the other surface of the first conductivity type semiconductor layer such that the first insulating layer is connected to the first preliminary insulating layer, and
wherein the forming of the second conductivity type lower electrode portion includes forming the second conductivity type lower electrode portion below the first insulating layer.

16. The method of claim 13, wherein the first conductivity type semiconductor layer further includes a protrusion portion protruding from a side surface of the second conductivity type semiconductor layer,
wherein the first conductivity type upper electrode portion and the first conductivity type lower electrode portion are disposed to correspond to each other with the protrusion portion interposed therebetween, and
wherein the semiconductor device further includes a first conductivity type electrode connection portion electrically connecting the first conductivity type upper electrode portion and the first conductivity type lower electrode portion.

17. The method of claim 13, wherein the second conductivity type electrode connection portion extends by penetrating through the active layer and the first and second conductivity type semiconductor layers.

18. The method of claim 13, wherein the second conductivity type electrode connection portion extends along side surfaces of the first and second conductivity type semiconductor layers.

19. The method of claim 13, wherein the first conductivity type upper electrode portion is disposed on one surface of the first conductivity type semiconductor layer exposed by an electrode hole penetrating through the second conductivity type semiconductor layer and the active layer.

20. The method of claim 19, further comprising:
forming a first insulating layer insulating the second conductivity type lower electrode portion and the first conductivity type semiconductor layer.

* * * * *